(12) United States Patent
Kobayashi et al.

(10) Patent No.: US 8,062,926 B2
(45) Date of Patent: Nov. 22, 2011

(54) MANUFACTURING METHOD FOR RFID TAG

(75) Inventors: Hiroshi Kobayashi, Kawasaki (JP); Kenji Kobae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 467 days.

(21) Appl. No.: 12/265,209

(22) Filed: Nov. 5, 2008

(65) Prior Publication Data

US 2009/0115611 A1 May 7, 2009

(30) Foreign Application Priority Data

Nov. 7, 2007 (JP) ................................. 2007-289707

(51) Int. Cl.
*H04L 21/00* (2006.01)

(52) U.S. Cl. ........ 438/108; 438/118; 438/119; 257/778; 29/843; 156/163

(58) Field of Classification Search .................. 438/106, 438/108, 118, 119; 156/163, 165, 292, 295; 257/778; 340/572.1, 572.7, 572.8; 29/831, 29/832, 842, 843
See application file for complete search history.

(56) References Cited

U.S. PATENT DOCUMENTS

| | | | | |
|---|---|---|---|---|
| 5,232,532 A | * | 8/1993 | Hori .............................. | 156/163 |
| 5,628,111 A | * | 5/1997 | Iwasaki et al. .................. | 29/841 |
| 6,077,382 A | * | 6/2000 | Watanabe ...................... | 156/322 |
| 6,821,813 B2 | * | 11/2004 | Su ................................ | 438/106 |
| 6,940,053 B2 | * | 9/2005 | Shi ............................... | 219/548 |
| 7,026,720 B2 | * | 4/2006 | Girard et al. ................... | 257/778 |
| 7,296,727 B2 | * | 11/2007 | Onobori et al. .......... | 228/180.22 |
| 7,323,360 B2 | * | 1/2008 | Gonzalez et al. ............. | 438/108 |
| 7,456,506 B2 | * | 11/2008 | Oberle ......................... | 257/784 |
| 2004/0036178 A1 | | 2/2004 | Girard et al. | |
| 2006/0057763 A1 | * | 3/2006 | Teo et al. ....................... | 438/64 |
| 2009/0166064 A1 | * | 7/2009 | Nishikawa et al. ........... | 174/254 |

FOREIGN PATENT DOCUMENTS

| | | |
|---|---|---|
| DE | 199 18 258 A1 | 11/2000 |
| DE | 102 05 914 A1 | 8/2003 |
| FR | 2 803 413 A1 | 7/2001 |
| JP | 9-315059 A | 12/1997 |
| JP | 2000-105804 A | 4/2000 |
| JP | 2000-194816 A | 7/2000 |
| JP | 2000-322538 A | 11/2000 |
| JP | 2001-167240 A | 6/2001 |
| JP | 2002-42090 A | 2/2002 |
| JP | 2003-58853 A | 2/2003 |
| WO | 02/097724 A1 | 12/2002 |
| WO | 2005/116920 A1 | 12/2005 |

OTHER PUBLICATIONS

European Search Report dated Mar. 17, 2009, issued in corresponding European Patent Application No. 08168517.4.

* cited by examiner

*Primary Examiner* — George Bugg
*Assistant Examiner* — Anne Lai
(74) *Attorney, Agent, or Firm* — Westerman, Hattori, Daniels Adrian, LLP

(57) ABSTRACT

An RFID tag manufacturing method is including application process in which a heat-curable adhesive is applied to an area where a circuit chip is placed on a base to which antennae are wired so as to be connected with the circuit chip, placement process in which the circuit chip is placed where the adhesive is applied, and thereby the circuit chip is connected with the antennae, covering process in which the circuit chip placed on the base is covered with a sheet member having an adhesive layer on its surface, such that the adhesive layer faces the base, and heat and pressure applying process in which pressure is applied to the sheet member toward the base, and heat and pressure are applied to the circuit chip from above the sheet member, thereby curing the adhesive and fixing the circuit chip and the sheet member on the base.

14 Claims, 22 Drawing Sheets

(STEP S11)

(STEP S12)

(STEP S13)

(STEP S14)

(STEP S15)

(STEP S121)

(STEP S122)

(STEP S123)

(STEP S124)

(STEP S14')

(STEP S15')

(STEP S21)

(STEP S22)

(STEP S31)

(STEP S32)

(STEP S33)

(STEP S34)

(STEP S35)

(STEP S41)

(STEP S42)

(STEP S51)

(STEP S52)

(STEP S53)

(STEP S54)

(STEP S55)

(STEP S56)

(STEP S57)

(STEP S56')

(STEP S57')

MANUFACTURING METHOD FOR RFID TAG

CROSS-REFERENCE TO RELATED APPLICATION

This application is based upon and claims the benefit of priority from the prior Japanese Patent Application No. 2007-289707 filed on Nov. 7, 2007, the entire contents of which are incorporated herein by reference.

BACKGROUND

1. Field

This art relates to RFID tag manufacturing methods for manufacturing RFID (Radio Frequency Identification) tags that transmit/receive information to/from external devices without touching the tags, and relates to RFID tags manufactured by RFID tag manufacturing methods. Among those skilled in the art, the term "RFID tag" used in this specification may be called "a wireless IC tag."

2. Description of the Related Art

Conventionally, known examples of an RFID tag that transmits/receives information to/from external devices (a representative example would be a reader/writer) by means of radio waves without touching the tag include an RFID tag (refer to, e.g., Patent Documents 1, 2, and 3) of the form in which radio communication antennae and a circuit chip are mounted on a base made of plastic or paper. And manufacturing methods for such RFID tags have been proposed (refer to, e.g., Patent Documents 1 and 2).

Such RFID tags may be used on articles that are easily deformed, such as clothing. However, such uses have significant problems in that a circuit chip is less likely to bend than a base, and the circuit chip and the area around it may be susceptible to bending stress, which would result in, for example, peeling of the circuit chip and disconnection of the antennae and circuit chip. To overcome such problem, technologies have been proposed in which the circuit chip and the area around it are coated with a resin or suchlike material, or the circuit chip, etc. are covered with hard reinforcement or suchlike, thereby protecting the circuit chip, etc. from deformation of RFID tags (see, for example, Patent Documents 4, 5, 6 and 7).

[Patent Document 1]
  Japanese Laid-open Patent Publication No. 2000-194816
[Patent Document 2]
  Japanese Laid-open Patent Publication No. 2000-105804
[Patent Document 3]
  Japanese Laid-open Patent Publication No. 2001-167240
[Patent Document 4]
  Japanese Laid-open Patent Publication No. 2000-322538
[Patent Document 5]
  Japanese Laid-open Patent Publication No. 2002-42090
[Patent Document 6]
  Japanese Laid-open Patent Publication No. 2003-58853
[Patent Document 7]
  Japanese Laid-open Patent Publication No. H9-315059

However, the protection of the circuit chip, etc., by a method as disclosed in the Patent Documents 4 to 7, for example, additionally includes the process of coating the circuit chip with a resin or mounting a reinforcement after the process of mounting the circuit chip on the base during the manufacture of the RFID tag. This additional process threatens to increase manufacturing costs.

SUMMARY

The present art has been proposed in view of the drawbacks described above. Accordingly, it is an object of the present art to provide an RFID tag manufacturing method whereby RFID tags in which circuit chips, etc. are protected can be manufactured with minimal manufacturing cost increases, and to provide RFID tags manufactured by such methods.

According to an aspect of an embodiment, there is provided a manufacturing method for an RFID tag including an application process in which a heat-curable adhesive is applied to an area where a circuit chip is placed on a base to which antennae are wired so as to be connected with the circuit chip to be placed; a placement process in which the circuit chip is placed in the area where the adhesive is applied in the application process, and thereby the circuit chip is connected with the antennae; a covering process in which the circuit chip placed on the base is covered with a sheet member having an adhesive layer on its surface, such that the adhesive layer faces the base; and a heat and pressure applying process in which pressure is applied to the sheet member toward the base, and heat and pressure are applied to the circuit chip from above the sheet member, thereby curing the adhesive and fixing the circuit chip and the sheet member on the base.

Additional objects and advantages of the art will be set forth in part in the description which follows and, in part will be obvious from the description, or may be learned by practice of the present art. The object and advantages of the art will be realized and attained by means of the elements and combinations particularly pointed out in the appended claims. It is to be understood that both the foregoing general description and the following detailed description are exemplary and explanatory only and are not restrictive of the art, as claimed.

DETAILED DESCRIPTION OF THE EMBODIMENTS

Embodiments according to the present art will hereinafter be described with reference to the accompanying drawings.

First, an RFID tag according to the first embodiment of the present art will be described.

Figure 1A:
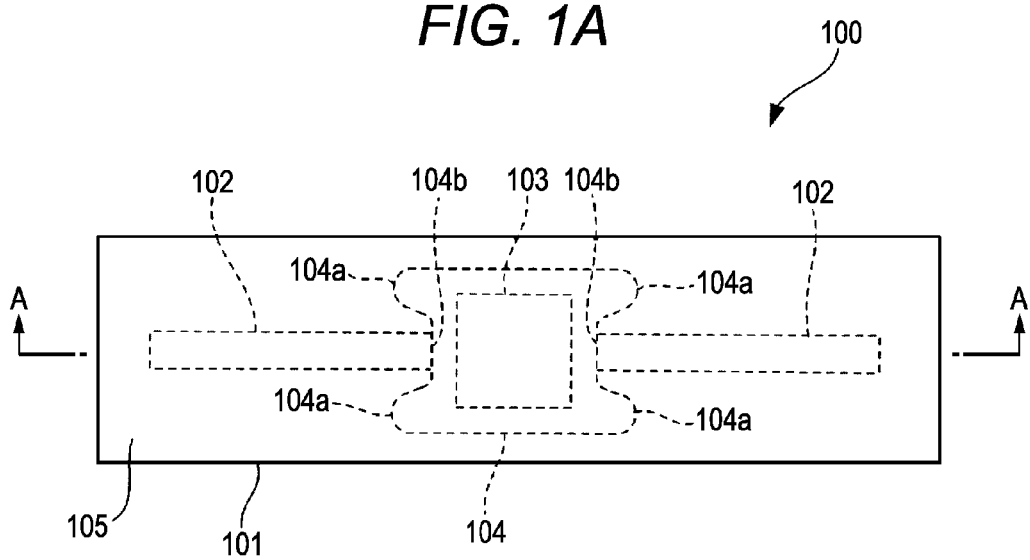
FIG. 1A is a plan schematic view of an RFID tag according to the first embodiment of the present art.
Figure 1B:
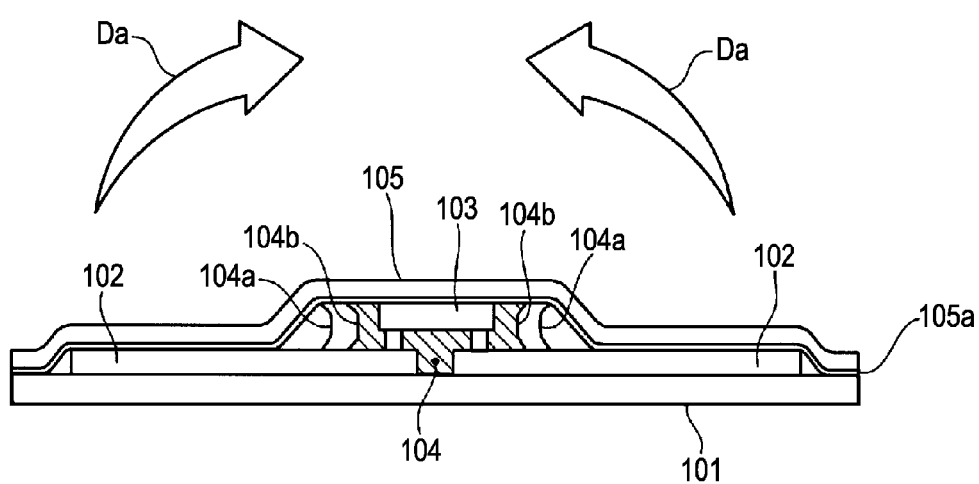
FIG. 1B is a sectional schematic view of the RFID tag shown in FIG. 1A.

FIGS. 1A and 1B are schematic views of the RFID tag according to the first embodiment of the present art.

FIG. 1A is a top view of the RFID tag 100, and FIG. 1B is a sectional view of the RFID tag 100, taken along the line A-A in FIG. 1A.

The RFID tag 100 shown in FIGS. 1A and 1B is attached to an article such as clothing, which may be deformed, and transmits/receives information about the article to/from an external device (a representative example would be a reader/writer) by means of radio waves without touching the tag 100. This RFID tag 100 includes: a specific base 101; antennae 102 wired to the base 101; a circuit chip 103 shaped as a rectangular plate, which is electrically connected to the antennae 102 and used for radio communication via the antennae 102; a heat-curable adhesive 104 with which the circuit chip 103 is fastened to the base 101; and a sheet member 105 made of PET film, having an adhesive layer 105a, and adhered to the circuit chip 103 side of the base 101, with the circuit chip 103 and adhesive 104 sandwiched between the base 101 and this member 105. The base 101, antennae 102, circuit chip 103, adhesive 104, and sheet member 105 are just examples of a base, antennae, circuit chip, adhesive, and sheet member for use in the present art.

In the first embodiment, the adhesive 104 is applied over a wider area of the base 101 than the circuit chip 103 including the part on which the circuit chip 103 is to be placed, as shown in FIGS. 1A and 1B. In addition, the adhesive 104 extends all the way to the tops of the sides of the circuit chip 103 placed on the base 101. In the first embodiment, the circuit chip 103, a connecting part for the circuit chip 103 and antennae 102, and so on, are coated with the adhesive 104 used to fasten the circuit chip 103. Accordingly, this adhesive 104 protects the circuit chip 103, etc., as well as fastening them.

In the first embodiment, it is assumed that the RFID tag 100 may be deformed during use such that the base 101 is bent in the directions indicated by arrows Da shown in FIG. 1B. In the first embodiment, the adhesive 104 has: first edges 104a brought into inward contact with one another when the base 101 curves in the directions of the arrows Da, and a second edge 104b located inside the first edges 104a where the base 101 curves and intersecting the wires of the antennae 102. Such an application pattern of the adhesive 104 serves to relieve stress otherwise concentrating on the antennae 102 when the base 101 is bent in the directions of the arrows Da. This effectively reduces the incidence of wire breakage caused by such concentration of stress.

Generally, deformation to which an RFID tag may be subject during use includes twisting as well as bending as mentioned above.

Next, an RFID tag designed to cope with twisting will be described as a modified example of the RFID tag 100 in the first embodiment.

Figure 2:
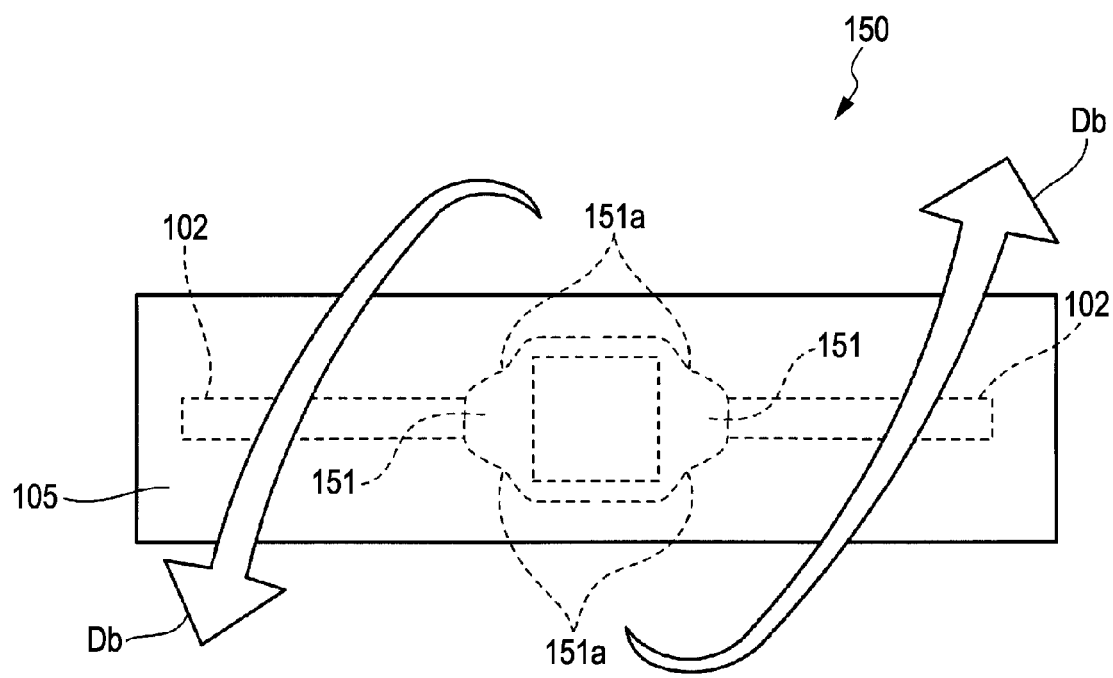
FIG. 2 is an example of an RFID tag that copes with twisting.

FIG. 2 is an example of an RFID tag that copes with twisting.

The RFID tag 150 shown in FIG. 2 is a modified example of the RFID tag 100 of the first embodiment shown in FIG. 1, and is identical to the RFID tag 100 shown in FIG. 1 except that the application pattern of the adhesive 151 for fastening the circuit chip 103 is different from that of the adhesive 104. In FIG. 2, components identical to those in FIG. 1 are labeled with the same reference numerals used in FIG. 1 and explanations of these components are not repeated here.

The adhesive 151 used for the RFID tag 150 shown in FIG. 2 is basically applied along the edges of the rectangular shape of the circuit chip 103 such that recesses 151a are formed in four areas of the edges. If the adhesive is applied such that upward projections harden along the edges of the rectangular shape, instead of the recesses 151a, stress caused when the base 101 is twisted in the directions of the arrows Db in FIG. 2 concentrates in the areas of these projections, and this may lead to peeling of adhesive 151. To avoid peeling, the RFID tag shown in FIG. 2 has recesses 151a in the four areas (where stress is most likely to concentrate when the base is twisted) of the edges of the adhesive 151. This effectively prevents peeling of the adhesive 151 if the base is twisted.

Next will be described an RFID tag manufacturing method according to the first embodiment of the present art.

Below is a description of the RFID tag manufacturing method for manufacturing the RFID tag 100 in the first embodiment shown in FIGS. 1A and 1B as the first embodiment of the RFID tag manufacturing method according to the present art.

FIGS. 3A-3E schematically show the RFID tag manufacturing method according to the first embodiment of the present art.

Figure 3A:
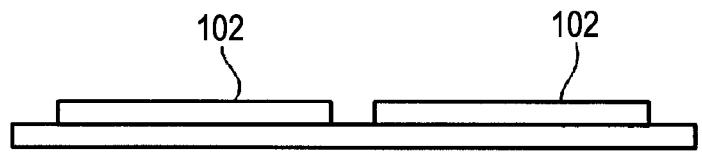
FIGS. 3A-3E are schematic views of the RFID tag manufacturing method according to the first embodiment of the present art.

In the RFID tag manufacturing method in FIGS. 3A-3E, a base 101 on which antennae 102 are wired is first prepared (step S11) (FIG. 3A).

Figure 3B:
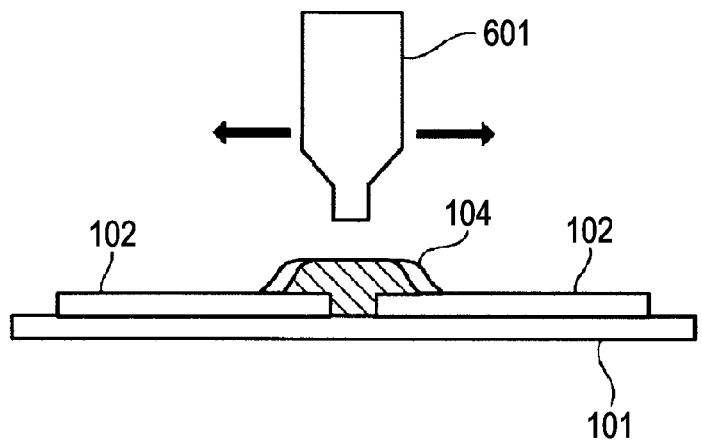

Next, a custom dispenser 601 applies an adhesive 104 to the base 101 (step S12) (FIG. 3B). The process in step S12 is an example of an application process according to the present art.

The adhesive 104 is applied such that, according to instructions from a control section (not shown), the dispenser 601 is moved to the left or right or in the direction of depth, as viewed in FIG. 3B. Thereby, the adhesive 104 assumes the application pattern shown in FIG. 1A.

FIGS. 4A-4D show in detail the process of applying the adhesive in step S12 in FIG. 3B.

Figure 4A:
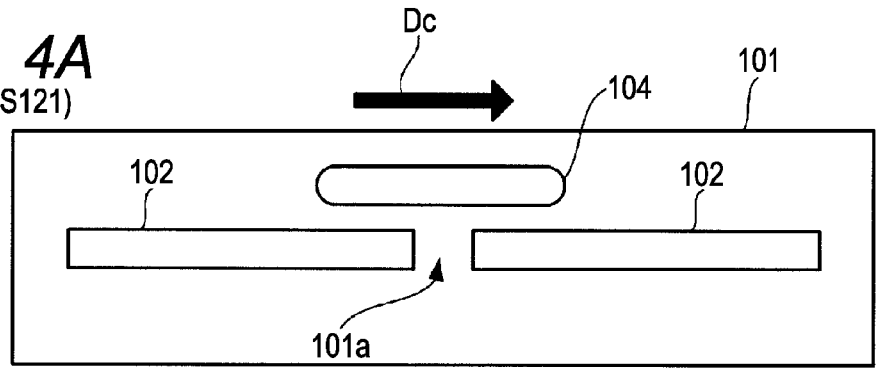
FIGS. 4A-4D show in detail the process of applying an adhesive in step S12 in FIG. 3.
Figure 4B:
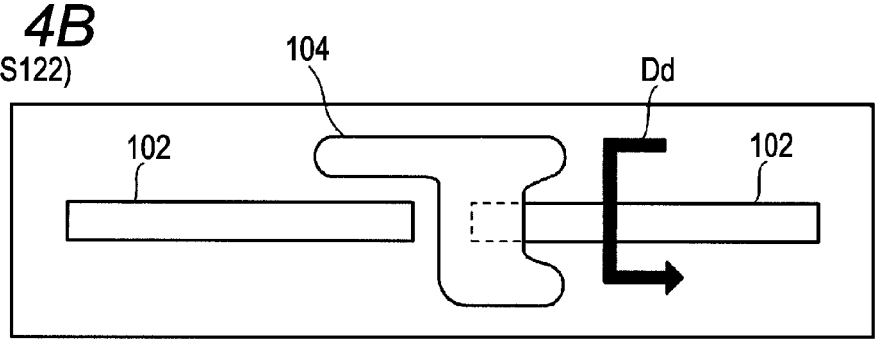
Figure 4C:
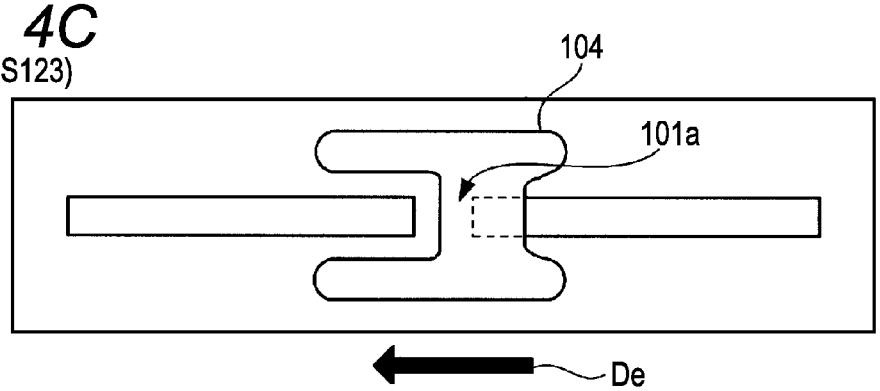
Figure 4D:
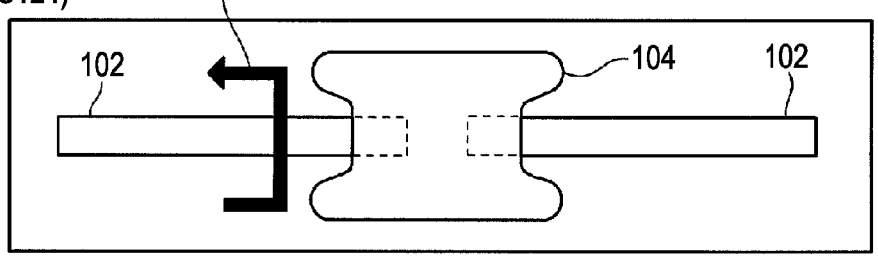

In the first embodiment, as shown in FIGS. 4A-4D, the dispenser 601 shown in FIG. 3B drops the adhesive 104 while moving from left to right above the position 101a of the circuit chip 103 shown in FIG. 1 on the base 101 as indicated by the arrow Dc in the drawing (step S121) (FIG. 4A). Subsequently, the dispenser 601 drops the adhesive 104 across the wiring forming one antenna 102 while moving to the left, down, and to the right, in that order, as indicated by the arrow Dd (step S122) (FIG. 4B). Further, the dispenser 601 drops the adhesive 104 while moving from the right to the left along the bottom of the circuit chip position 101a, as indicated by the arrow De (step S123) (FIG. 4C). Finally, the dispenser 601 drops the adhesive 104 across the wiring forming another antenna 102 while moving to the right, up, and to the left, in that order, as indicated by arrow Df (step S124) (FIG. 4D). Thus, the adhesive 104 assumes the application pattern shown in FIG. 1A.

On account of the series of movements of the dispenser 601 described above, the adhesive 104 is applied over an area wider than the circuit chip 103 so as to have two kinds of edges 104a and 104b shown in FIG. 1A. In this embodiment, the quantity of adhesive 104 applied by the series of movements is the quantity required for the adhesive 104 to be applied all the way to the tops of the sides of the circuit chip 103 put in its position 101a.

The foregoing is a description of the application of the adhesive 104, and referring back to FIGS. 3A-3E, the subsequent processes of the RFID tag manufacturing method will be described below.

Figure 3C:
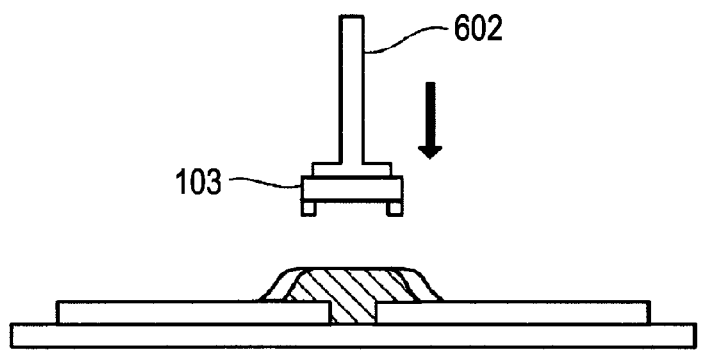

Upon finishing the application of the adhesive 104, a custom chip mounter 602 conveys a circuit chip 103 onto the adhesive 104 applied, and thus locates the circuit chip 103 on the base 101 and in position 101a (refer to FIG. 4A) of the circuit chip 103 (step S13) (FIG. 3C). At this time, as described above, the adhesive 104 covers all the way to the tops of the sides of the circuit chip 103. The process of the step S13 is an example of a placement process according to the present art.

Figure 3D:
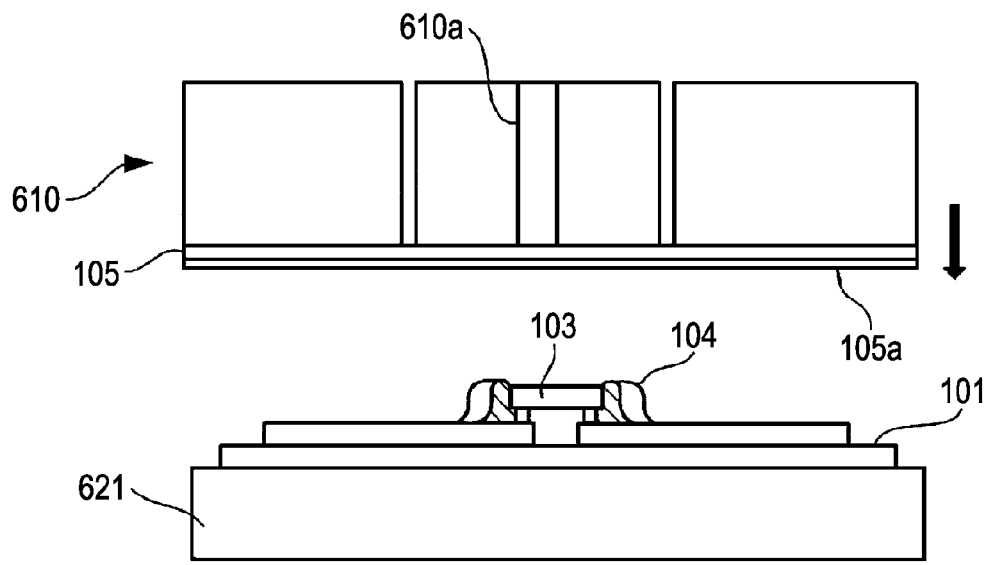

Subsequently, a heat pressure head 610 is lowered toward the base 101 on a table 621 in order to heat and cure the adhesive 104 and press the circuit chip 103 so as to prevent the circuit chip 103 from floating in the uncured adhesive 104 (step S14) (FIG. 3D). At this time, a sheet member 105, which is also shown in FIG. 1, is sucked toward the heat pressure head 610 by air drawn from a suction hole 610a, such that the adhesive layer 105a side of the heat pressure head 610 faces the base 101. With the sheet member 105 positioned so as to be superposed on the base 101 within a predetermined range of error, the heat pressure head 610 is lowered. The heat pressure head 610 also serves to apply pressure in order to fix the sheet member 105 onto the base 101. Although not shown in FIGS. 3B and 3C, the process in both the steps S12 and S13 take place with the base 101 kept on the table 621.

Figure 5A:
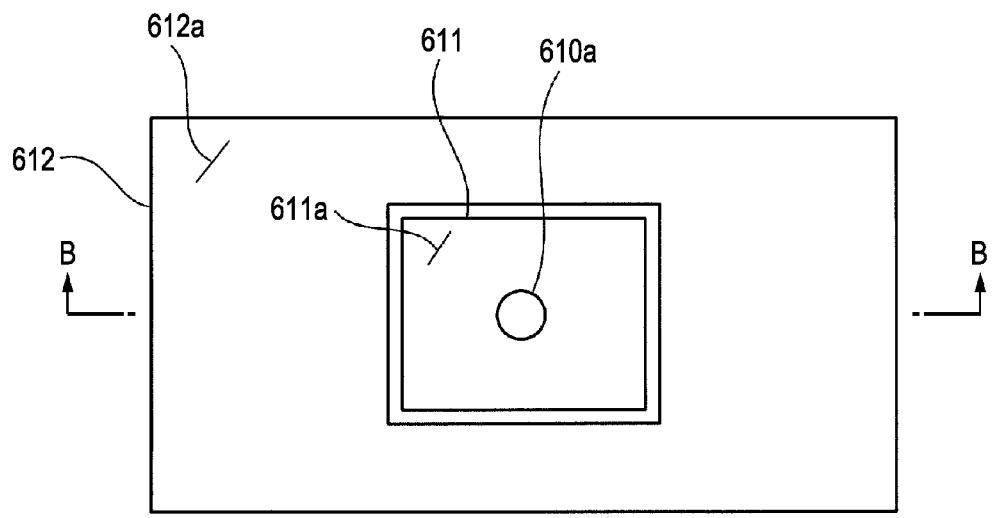
FIG. 5A is a plan schematic view of a heat pressure head 610 shown in FIGS. 3A-3E.
Figure 5B:
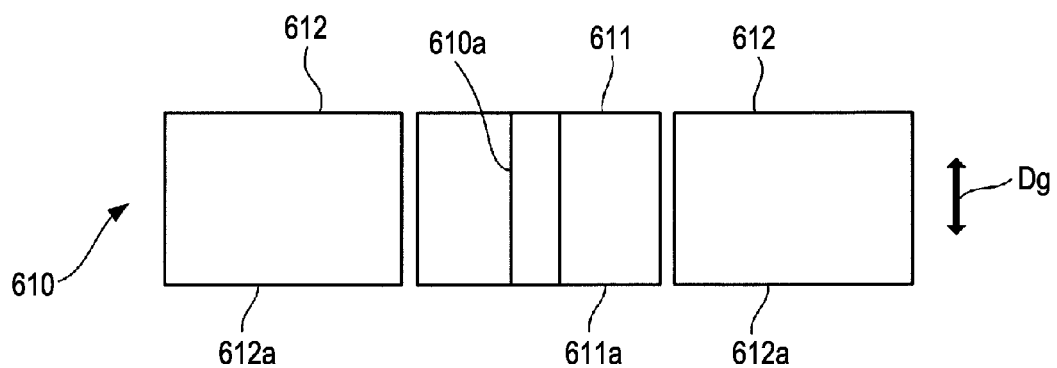
FIG. 5B is a sectional schematic view of the heat pressure head shown in FIG. 5A.

The heat pressure head 610 will now be described below.
FIGS. 5A and 5B are schematic views of the heat pressure head 610 shown in FIG. 3D.

FIG. 5A is a bottom view of the heat pressure head 610, and FIG. 5B is a sectional view of the heat pressure head 610, taken along the line B-B in FIG. 5A.

The heat pressure head 610 includes: a first area 611 that has a first surface 611a occupying the central area of the bottom and also has a suction hole 610a; a second area that has a second surface 612a surrounding the first surface 611a and is movable in the direction in which the first area 611 is pulled or inserted as indicated by the arrows Dg. Here, the first surface 611a and the second surface 612a are examples of first and second surfaces respectively in the present art, and the first area 611 and second area 612 are examples of first and second areas respectively in the present art.

In the heat pressure head 610, the first area 611 and second area 612 move independently upward or downward, as shown in FIG. 5B, and pressure applied to and the heating temperatures of the first and second areas 611 and 612 are all independently controlled.

Referring back to FIG. 3E, the operation of the heat pressure head 610 in the first embodiment will now be described.

When the sheet member 105 reaches the circuit chip 103 in step S15 following step S14 described above, the first area 611 of the heat pressure head 610 applies pressure P1 to an area (corresponding to the circuit chip 103) of the sheet member 105 to such a degree as to prevent floating of the circuit chip 103. Simultaneously, the first area 611 heats this area at temperature T1 required for the adhesive 104 to be heated and cured. When an area (beyond the circuit chip 103) of the sheet member 105 reaches the base 101, the second area 612 presses this area (including any area in contact with the antennae 102 wired on the base 101) with pressure P2 required to fix the sheet member 105 in position. Simultaneously, the second area 612 heats the sheet member 105 at predetermined temperature T2. In the first embodiment, the first area 611 applies pressure sufficient to prevent floating of the circuit chip 103, and does not have to fix the sheet member 105 in position. Therefore, the pressure P1 applied by the first area 611 is lower than the pressure P2 applied by the second area 612. In addition, the second area 612 serves only to fix the sheet member 105 to the base 101 and does not require heating basically. However, according to the first embodiment, in order to prevent the heat of the first area 611 from scattering, the second area 612 is heated at the temperature T2, set lower than temperature T1 at which the first area 611 is heated. The foregoing process in the step S15 is an example of a combination of covering process and heat and pressure applying processes in the present art.

In the process in step S15, heat and pressure are applied for a predetermined length of time in the manner described above. When heating and curing of the adhesive 104 and fixing of the sheet member 102 are finished, the RFID tag 100 is complete.

The RFID tag manufacturing method according to the first embodiment described with reference to FIGS. 3A to 5B is efficient because at the same time that sheet member 105 is fixed after being attached, heat and pressure are applied to cure the adhesive 104 for fastening the circuit chip 103. In this RFID tag manufacturing method, the application of heat and pressure is carried out via the sheet member 105. Accordingly, the adhesive 104 is securely prevented from contaminating the first and second area 611 and 612 that apply heat and pressure. This makes it possible to apply a larger quantity of adhesive 104, as shown in FIGS. 3A to 4D, such that the adhesive 104 covers all the way to the tops of the sides of the circuit chip 103, thereby adequately protecting the circuit chip 103, etc. Thus, the RFID tag manufacturing method according to the first embodiment enables the protection of the circuit chip 103 without including special processes such as coating the circuit chip with a resin material or covering the circuit chip with a hard reinforcement member or suchlike. Accordingly, manufacturing cost increases associated with such additional processes can be avoided. That is, according to the RFID tag manufacturing method in the first embodiment, the RFID tag 100 in which the circuit chip 103, etc., are protected can be manufactured minimizing increases in manufacturing costs.

In the foregoing, the heat pressure head used in the RFID tag manufacturing method according to the first embodiment is exemplified by the heat pressure head 610 that has two areas, the operations of which are independently controlled, as shown in FIGS. 3A to 3E and 5A to 5B. However, in the RFID tag manufacturing method in the first embodiment, in lieu of the heat pressure head 610, pressure and heat may be applied using a heat pressure head of a form different from the heat pressure head 610, as described below.

Figure 6A:
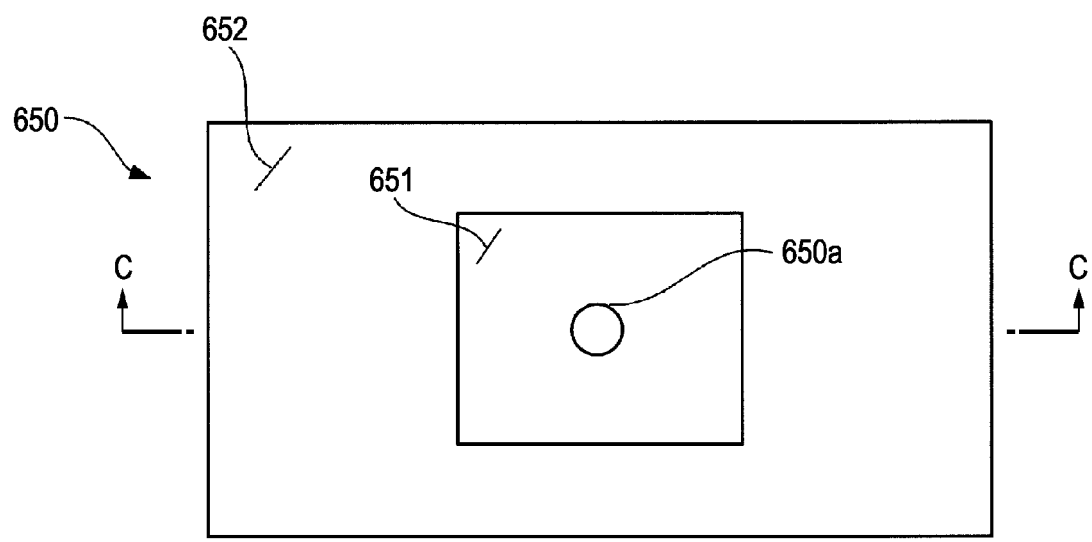
FIG. 6A is a view of a heat pressure head of a form different from the heat pressure head 610 utilized in FIGS. 3A to 5B and used in the RFID tag manufacturing method in the first embodiment.
Figure 6B:
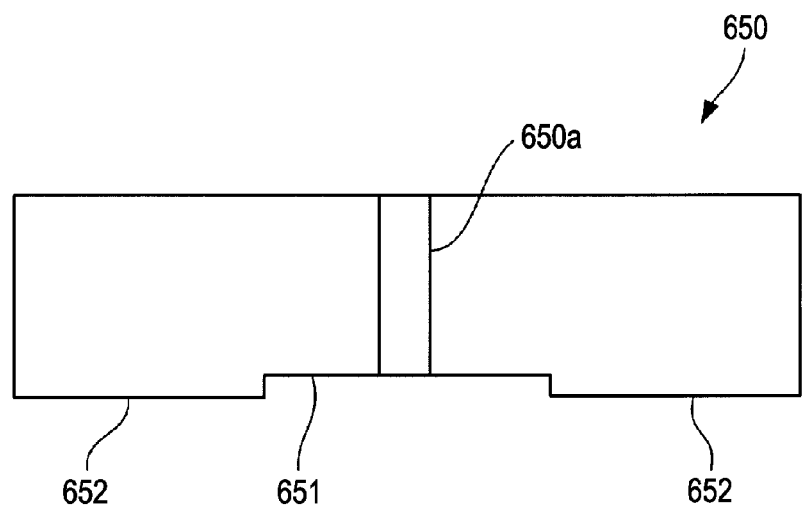
FIG. 6B is a sectional view of the heat pressure head shown in FIG. 6A.

FIGS. 6A and 6B show a heat pressure head of a form different from the heat pressure head 610 shown in FIGS. 3A-3E and 5A-5B and used in the RFID tag manufacturing method in the first embodiment.

FIG. 6A is a bottom view of another form of heat pressure head 650, and FIG. 6B is a sectional view of the heat pressure head 650, taken along the line C-C in FIG. 6A. This heat pressure head 650 is another example of the heat pressure head applicable in the present art.

This heat pressure head 650 has a first surface 651 occupying the central area of the bottom, and a second surface 652 surrounding the first surface 651 and extending higher than the first surface 651. A suction hole 650a is made in the first surface 651.

The operation of the heat pressure head 650 of this form will now be described.

Figure 7A:
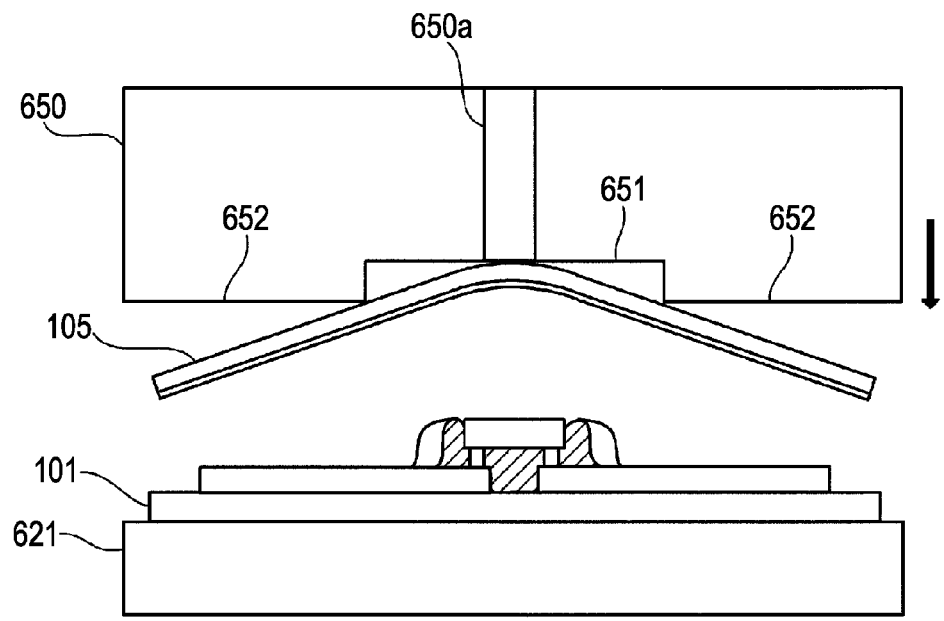
FIG. 7A-7B are schematic views illustrating operation of the heat pressure head 650 shown in FIGS. 6A-6B in another configuration.
Figure 7B:
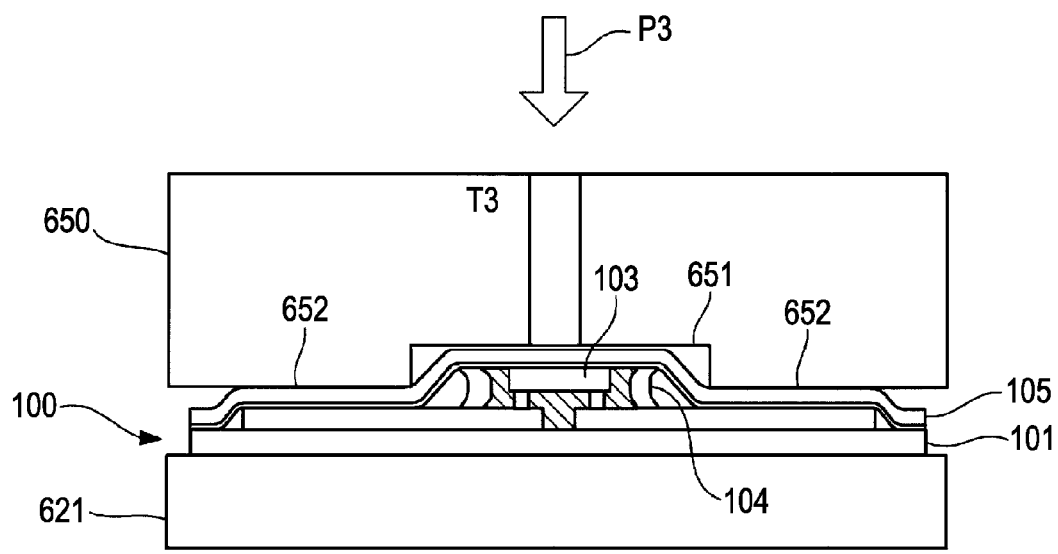

FIGS. 7A-7B are schematic views illustrating operation of the heat pressure head 650 shown in FIG. 6.

In FIG. 7B, a process in step S15' corresponding to that in step S15 is shown. The process in step S15' is an example of a combination of a coating process and a heat and pressure applying process according to the present art.

In the process in step S14', while the sheet member 105 is sucked into position by air drawn from the suction hole 650a, the heat pressure head 650 is lowered onto the base 101 etc. placed on the table 621. Unlike the heat pressure head 610 in FIGS. 3A-3E and 5A-5B, the first surface 651 and second surface 652 of this heat pressure head 650 are at different levels and when suction is applied to the sheet member 105, the sheet member 105 bends slightly due to this difference in level, as shown in FIG. 7A.

In the process in step S15', heat and pressure are applied by the heat pressure head 650. The difference in level between the first and second surfaces 651 and 652 is equivalent to the height of the circuit chip 103. Accordingly, when the heat pressure head 650 is lowered, the sheet member 105 reaches the upper faces of the circuit chip 103 and base 101 almost simultaneously. In the heat pressure head 650, the first and second surfaces 651 and 652 are integrally molded and, therefore, the entire sheet member 105 is subjected to a uniform pressure P3. In the application of pressure by the heat pressure head 650, the load applied to the circuit chip 103 is slightly greater than that in the heat pressure head 610 shown in FIGS. 3A-3E and 5A-5B. To offset this, the pressure P3 applied by the heat pressure head 650 is set to an appropriate value according to a combination of the load applied to the circuit chip 103 and pressure required to fix the sheet member 105. In addition, the heat pressure head 650 is set to heating temperature T3 that is required to heat and cure the adhesive 104. In the heat pressure head 650, only one setting requires control in pressure and in heat. Therefore, heat and pressure are simply controlled, especially if compared to the heat pressure head 610 shown in FIGS. 3A-3E and 5A-5B. Thus, manufacture of an RFID tag 100 is complete.

The foregoing is a description of an RFID tag and an RFID tag manufacturing method according to the first embodiment of the present art. Next will be described an RFID tag according to the second embodiment of the present art.

Figure 8A:
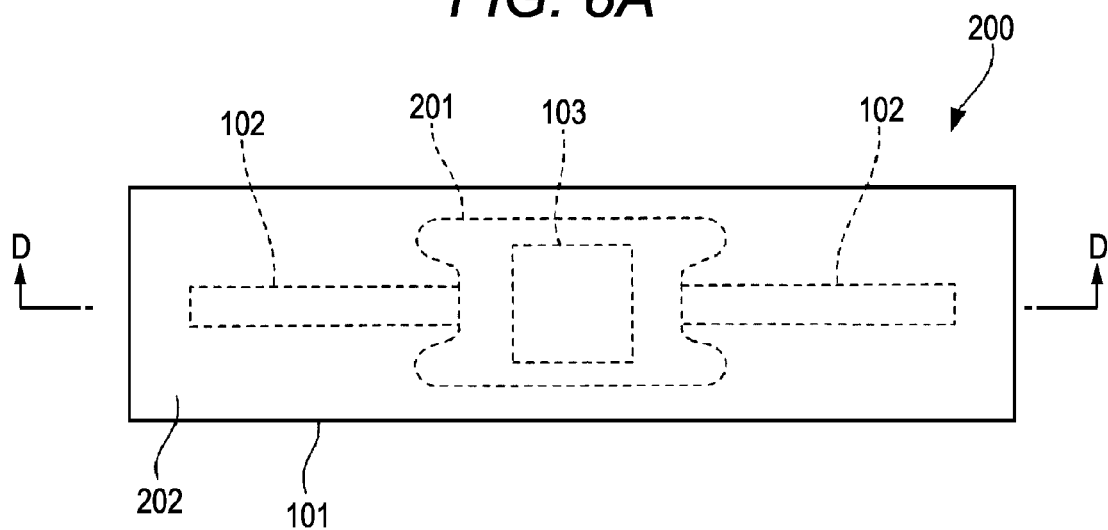
FIG. 8A is a plan schematic view of an RFID tag according to the second embodiment of the present art.
Figure 8B:
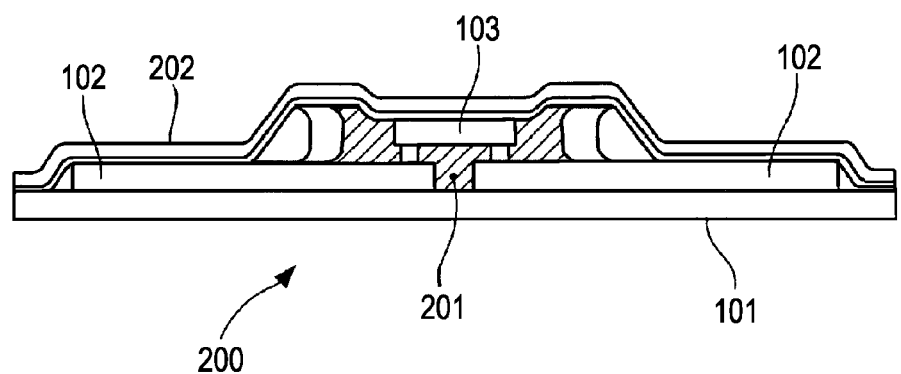
FIG. 8B is a sectional schematic view of the RFID tag shown in FIG. 8A.

FIGS. 8A and 8B are schematic views of an RFID tag according to the second embodiment of the present art.

FIG. 8A is a top view of an RFID tag 200 according to the second embodiment, and FIG. 8B is a sectional view of the RFID tag 200, taken along the line D-D indicated in FIG. 8A.

The RFID tag 200 in the second embodiment shown in FIGS. 8A and 8B is identical to the RFID tag 100 in the first embodiment shown in FIGS. 1A and 1B, except that the adhesive application pattern and the sheet member shape deriving from the adhesive application pattern are different from those in the RFID tag 100. In FIGS. 8A and 8B, components identical to those in FIGS. 1A and 1B are labeled with the same reference numerals used in FIGS. 1A and 1B and explanations of these components are not repeated here; explanations instead will focus on differences.

In the RFID tag 200 in FIGS. 8A and 8B, the adhesive 201 that fastens the circuit chip 103 and protects the circuit chip 103 covers the outside of the circuit chip 103 all the way to the tops of the sides of the circuit chip 103. In addition, the adhesive 201 covering the outside of the circuit chip 103 overflows beyond the upper face of the circuit chip 103, as shown in FIG. 8B. A sheet member 202 follows the line of the overflow of the adhesive 201. The adhesive 201 and sheet member 202 in the second embodiment are examples of the adhesive and the sheet member in the present art, respectively.

In the RFID tag 200 shown in FIGS. 8A and 8B, since the adhesive 201 assumes the application pattern mentioned above, the adhesive 201 overflowing beyond the upper face of the circuit chip 103 is subject to external force, etc., applied to the circuit chip 103 from above, and thereby reduces the load on the circuit chip.

Next will be described an RFID tag manufacturing method (i.e., a method for manufacturing the RFID tag 200 shown in FIGS. 8A and 8B) according to the second embodiment of the present art.

The RFID tag manufacturing method in the second embodiment is identical to that in the first embodiment described with reference to FIGS. 3A to 5B, except that the shape of the heat pressure head is different from that of the heat pressure head in the first embodiment. A description will be given focusing on this difference.

Figure 9A:
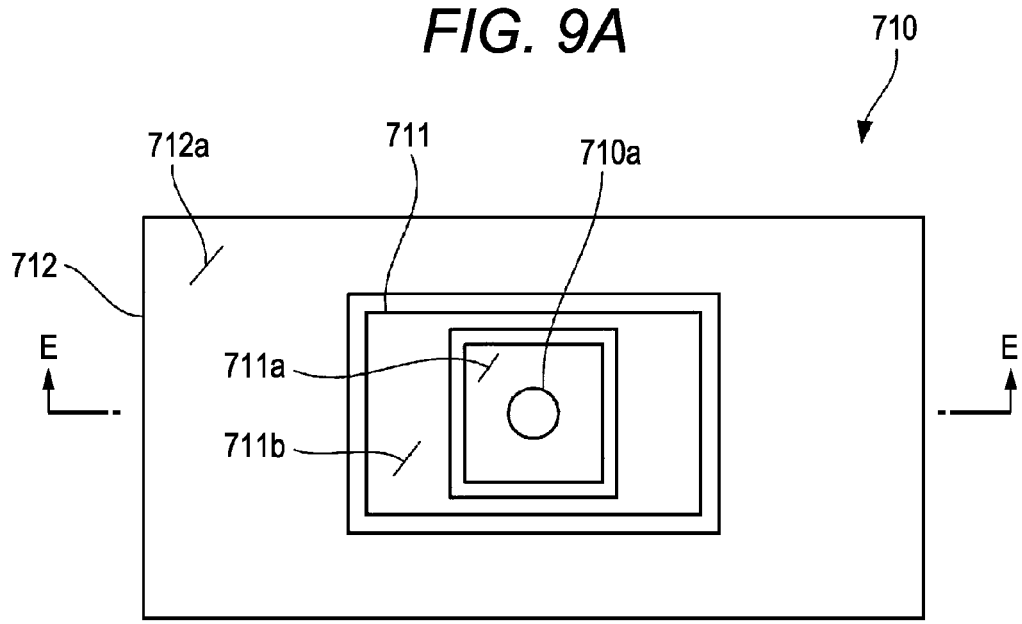
FIG. 9A is a plan schematic view of a heat pressure head used in an RFID tag manufacturing method according to the second embodiment.
Figure 9B:
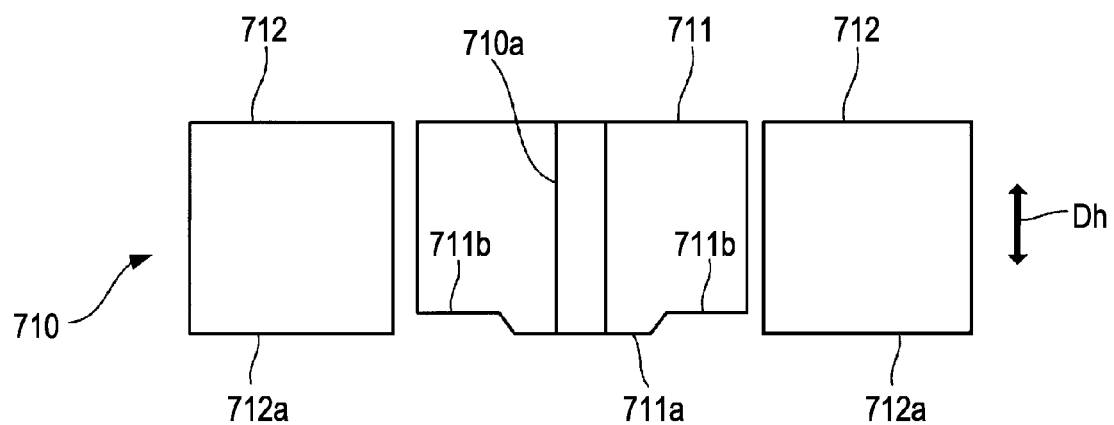
FIG. 9B is a sectional schematic view of the heat pressure head shown in FIG. 9A.

FIGS. 9A and 9B are schematic views of a heat pressure head used in an RFID tag manufacturing method according to the second embodiment.

FIG. 9A is a bottom view showing the underside of the heat pressure head 710, FIG. 9B is a sectional view of the heat pressure head 710, taken along the line E-E in FIG. 9A.

The heat pressure head 710 includes: a first area 711 having a first surface 711a occupying the central area of the underside of the head 710; and a second area 712 having a second surface 712a surrounding the first surface 711a, and disposed so as to allow the first area 711 to be inserted or pulled in the directions indicated by arrows Dh. The first area 711 also has a third surface 711b surrounding the first surface 711a and lower than this first surface 711a. Here, the first surface 711a, second surface 712a, and third surface 711b are examples of the first, second, and third surfaces of the present art, respectively. The first area 711 and second area 712 are also examples of the first and second areas of the present art.

In the heat pressure head 710, the first and second areas 711 and 712 move independently vertically as shown in FIG. 9A. The pressures that the first and second areas 711 and 712 apply are also controlled separately, and so are the heating temperatures of the first and second areas 711 and 712.

Next will be described operation of the heat pressure head 710 in the RFID tag manufacturing method in the second embodiment.

Figure 10A:
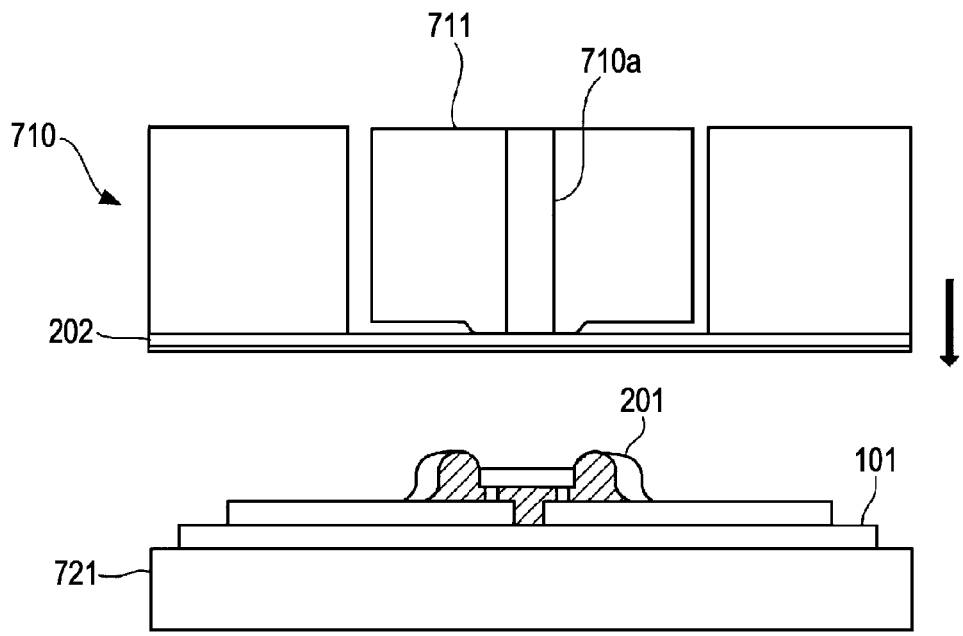
FIGS. 10A-10B are schematic views illustrating operation of the heat pressure head 710 shown in FIGS. 9A and 9B and used in the RFID tag manufacturing method in the second embodiment.
Figure 10B:
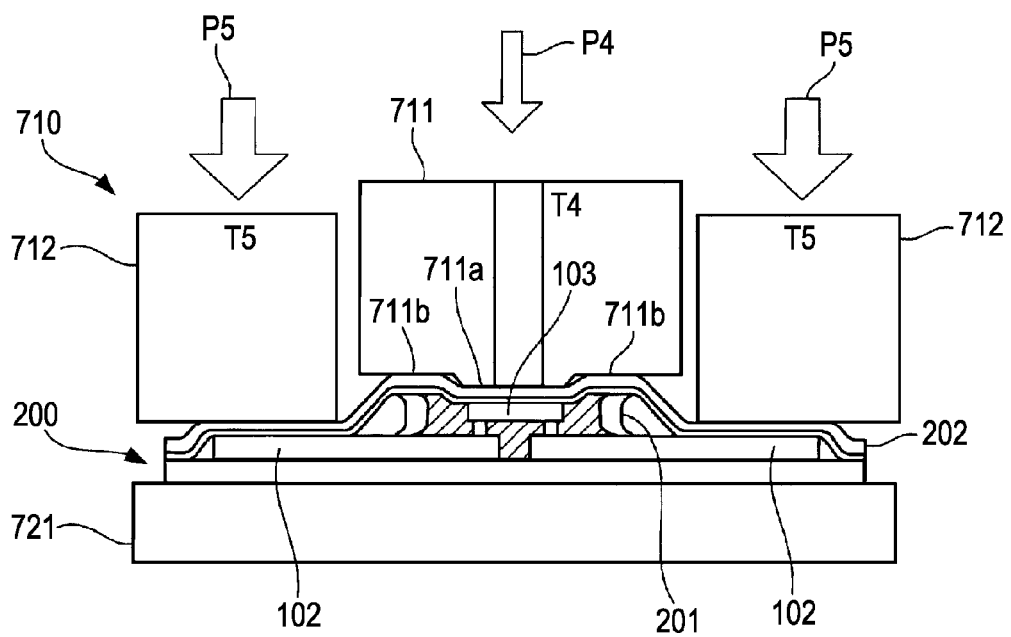

FIGS. 10A and 10B are schematic views illustrating operation of the heat pressure head 710 shown in FIGS. 9A and 9B and used in the RFID tag manufacturing method in the second embodiment.

Figure 3E:
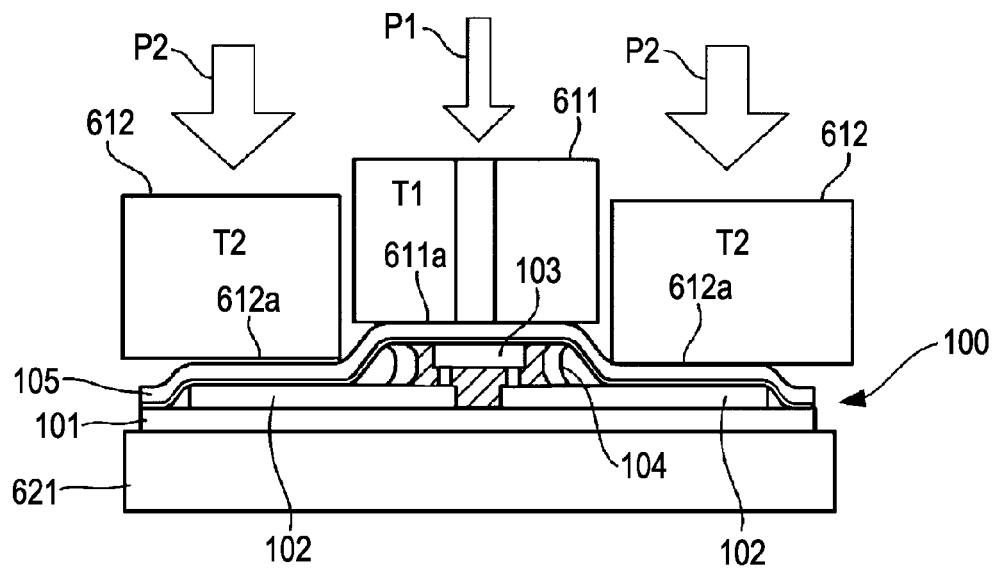

FIGS. 10A and 10B show the processes in steps S21 and S22, which correspond to those in steps S14 and S15 respectively in the RFID tag manufacturing method in the first embodiment illustrated in FIGS. 3D-3E. The process in step S22 is an example of a combination of the covering process and heat and pressure applying process according to the present art.

In the RFID tag manufacturing method in the second embodiment, processes corresponding to those in steps S11 to S13 in the RFID tag manufacturing method in the first embodiment illustrated in FIGS. 3A-3C are basically the same as those in the first embodiment and explanations of these are not repeated here. However, in the RFID tag manufacturing method in the second embodiment, throughout the processes, the quantity of adhesive 201 applied to the base 101 is larger than that in the RFID tag manufacturing method in the first embodiment. The larger quantity of adhesive applied to the outside of the circuit chip 103 is required so that when the circuit chip 103 is placed therein, the adhesive 201 not only covers all the way to the tops of the sides of the circuit chip 103 but also overflows beyond the upper face of the circuit chip 103.

In step S21 shown in FIG. 10A, the heat pressure head 710 shown in FIGS. 9A-9B is lowered toward the base 101 placed on a table 721. At this time, a sheet member 202, as shown in FIG. 8A, is sucked onto the heat pressure head 710 by air drawn from a suction hole 710 made in the first area 711. With the sheet member 202 positioned so as to be superposed on the base 101 within a predetermined range of error, the heat pressure head 710 is lowered.

In the process in step S22 shown in FIG. 10B, when the sheet member 202 reaches the circuit chip 103, the first surface 711a, as shown in FIGS. 9A and 9B, of the first area 711 of the heat pressure head 710 applies pressure P4 to an area (corresponding to the circuit chip 103) of the sheet member 202 to such a degree as to prevent floating of the circuit chip 103. Also, the third surface 711b surrounding the first surface 711a applies the same pressure P4 to areas (corresponding to areas of the adhesive 201 overflowing beyond the circuit chip 103) of the sheet member 202. The surfaces 711a and 711b of the first area 711 heat the corresponding areas at the temperature T4 required for the adhesive 201 to be heated and cured. When the sheet member 202 reaches the base 101, the second area 712 presses the base 101 (including any area in contact with antenna 102 wired on the base 101) at pressure P5 required to fix the sheet member 202 in position. Simultaneously, the second area 712 heats the sheet member 202 at predetermined temperature T5. The pressure P4 applied by the first area 711 is lower than pressure P5 applied by the second area 712. The temperature T4 at which the first area 711 is heated is higher than the temperature T5 at which the second area 712 is heated.

In the process in step S22, the heat and pressure are applied in the manner described above for a predetermined length of time. When heating and curing of the adhesive 201 and fixing of the sheet member 202 are finished, the RFID tag 200 is complete.

As in the RFID tag manufacturing method in the first embodiment as described above, the RFID tag 200 in which the circuit chip 103, etc. are protected can be manufactured in a manner to minimize increases in manufacturing costs. In addition, the overflow of the adhesive 201 beyond the circuit chip 103 provides significant protection for the circuit chip 103, etc.

The foregoing is a description of an RFID tag and RFID tag manufacturing method according to the second embodiment of the present art. Next will be described an RFID tag according to the third embodiment of the present art.

Figure 11A:
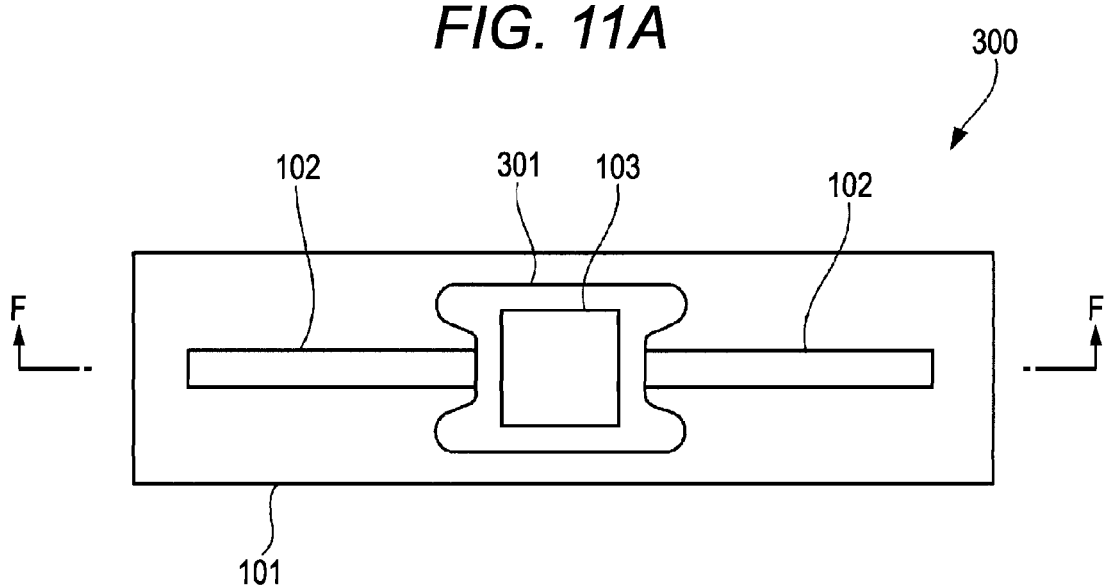
FIG. 11A is a plan schematic view of an RFID tag according to the third embodiment of the present art.
Figure 11B:
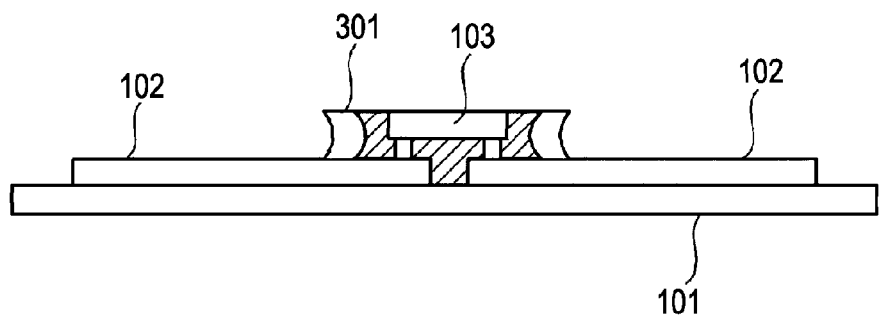
FIG. 11B is a second schematic view of the RFID tag shown in FIG. 11A.

FIGS. 11A and 11B are schematic views of an RFID tag according to the third embodiment of the present art.

FIG. 11A is a top view of an RFID tag 300 according to the third embodiment, and FIG. 11B is a sectional view of the RFID tag 300, taken along the line F-F shown in FIG. 11A.

The RFID tag 300 in the third embodiment shown in FIGS. 11A and 11B is identical to the RFID tag 100 in the first embodiment shown in FIGS. 1A and 1B, except that a sheet member is not applied and, therefore, an adhesive 301 is exposed. In FIGS. 11A and 11B, components identical to those in FIGS. 1A and 1B are labeled with the same reference numerals used in FIGS. 1A and 1B and duplicate explanations are avoided; explanations instead will focus on differences.

In the RFID tag 300 in FIGS. 11A and 11B, the adhesive 301 that fastens the circuit chip 103 in place also protects the circuit chip 103 by covering the outside of the circuit chip 103 all the way to the tops of the sides of the circuit chip 103. The adhesive 301 in this embodiment is an example of an adhesive applicable in the present art.

Next will be described a method for manufacturing the RFID tag 300 in the third embodiment shown in FIGS. 11A and 11B.

FIGS. 12A to 12E are schematic views illustrating an RFID tag manufacturing method according to the third embodiment of the present art.

Figure 12A:
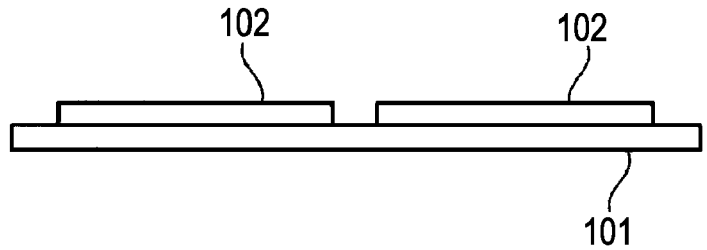
FIGS. 12A-12E are schematic views illustrating an RFID tag manufacturing method according to the third embodiment of the present art.
Figure 12B:
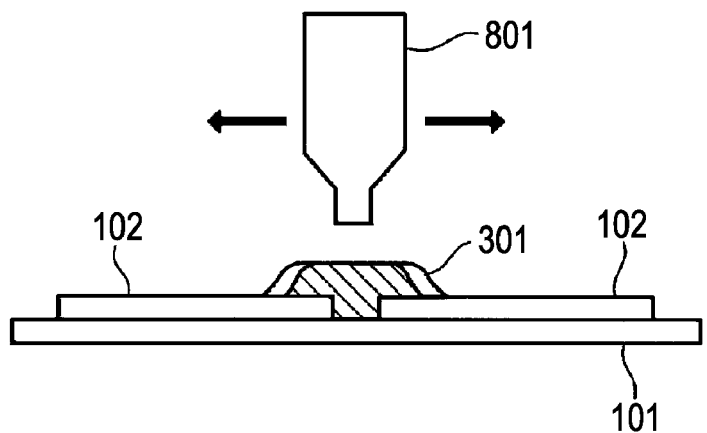
Figure 12C:
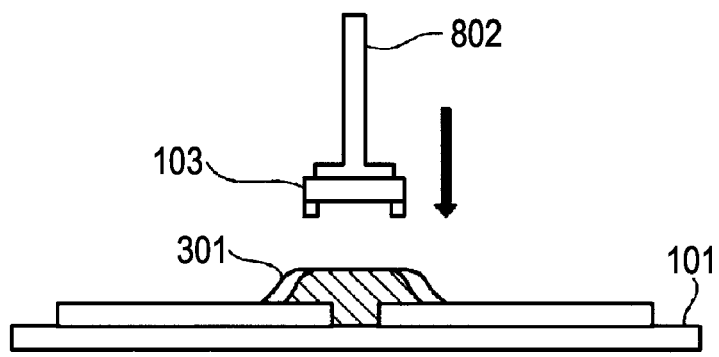

In the RFID tag manufacturing method in FIG. 12A, a base 101 on which antennae 102 are wired is first prepared (step S31). Next a custom dispenser 801 applies an adhesive 301 onto the base 101 in the same manner shown in FIGS. 4A-4D (step S32) (FIG. 12B). A custom chip mounter conveys a circuit chip 103 onto the place where adhesive 301 has been applied, and thus locates the circuit chip 103 on the base 101 and in a correct position for the circuit chip 103 (step S33) (FIG. 12C). After step S33, the adhesive 301 covers all the way to the tops of the sides of circuit chip 103. The processes in steps S32 and S33 are examples of an adhesive applying process and a heat and pressure applying process respectively according to the present art.

Figure 12D:
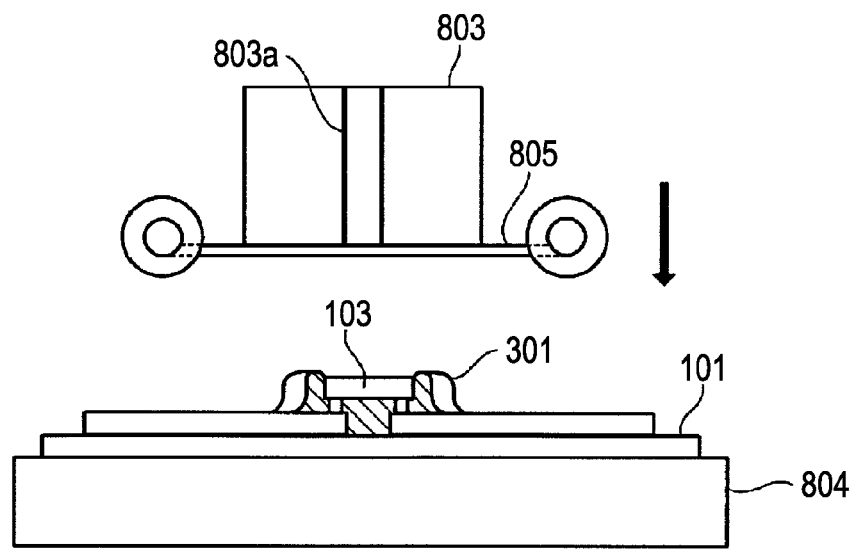

Subsequently, while air drawn from the suction hole 803a sucks a separation sheet 805 into position, a heat pressure head 803, which applies heat to cure the adhesive 301 and pressure to prevent the circuit chip 103 from floating in the yet uncured adhesive 301, is lowered toward the base 101 placed on a table 804 (step S34) (FIG. 12D). The separation sheet 805 is a sheet of fluorocarbon resin, specifically Teflon (registered trademark) film, and is not susceptible to the adhesive 301. The separation sheet 805 is an example of "a non-adhering sheet" in the present art. Although not shown in FIGS.

12B and 12C, processes in both steps S32 and S33 described above are performed with the base 101 placed on the table 804.

In step S35 (FIG. 12E) (subsequent to step S34), when the separation sheet 805 reaches the circuit chip 103, the heat pressure head 803 applies pressure P6 to the circuit chip 103 and to the adhesive 301 around the circuit chip 103 via the separation sheet 805, to such a degree as to prevent floating of the circuit chip 103. Simultaneously, the heat pressure head 803 heats these areas via the separation sheet 805 at temperature T7 required to heat and cure the adhesive 301.

In the process in step S35, such heat and pressure are applied for a predetermined length of time. When heating and curing of the adhesive 301 are finished and the heat pressure head 803 is raised to its original position, the separation sheet 805, which is not susceptible to the adhesive 301, peels off from the adhesive 301. Consequently, the RFID tag 300 in which the cured adhesive 301, etc. are exposed is complete. The process in step S35 is an example of a combination of covering process, heat and pressure applying process, and peeling process in the present art.

In the RFID tag manufacturing method according to the third embodiment described with reference to FIG. 12E, heat and pressure for curing the adhesive 301 are applied via the separation sheet 805. Accordingly, the adhesive 301 is securely prevented from contaminating the heat pressure head 803 that applies the heat and pressure. This makes it possible to apply a larger quantity of adhesive 301 such that the adhesive 301 covers all the way to the tops of the sides of circuit chip 103, thereby providing adequate protection for the circuit chip 103 by the adhesive 301. Thus, as in the RFID tag manufacturing method in the first embodiment described above, the RFID tag manufacturing method in the third embodiment makes it possible to manufacture an RFID tag 200 in which the circuit chip 103, etc. are protected, with minimal increases in manufacturing costs.

The foregoing is a description of an RFID tag and an RFID tag manufacturing method according to the third embodiment of the present art. Next will be described an RFID tag according to the fourth embodiment of the present art.

Figure 13A:
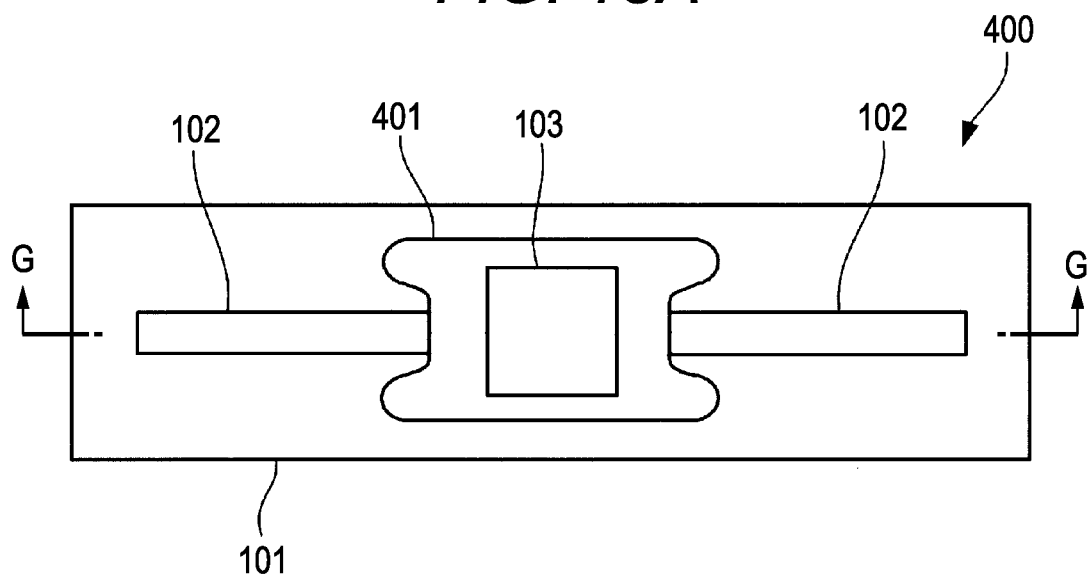
FIG. 13A is a plan schematic view of an RFID tag according to the fourth embodiment of the present art.
Figure 13B:
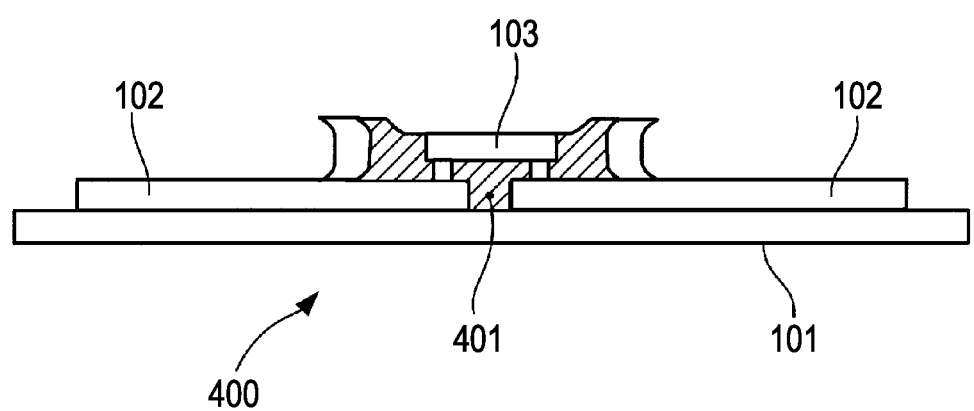
FIG. 13B is a sectional schematic view of the RFID tag shown in FIG. 13A.

FIGS. 13A and 13B are schematic views of an RFID tag according to the fourth embodiment of the present art.

FIG. 13A is a top view of an RFID tag 400 according to the fourth embodiment, and FIG. 13B is a sectional view of the RFID tag 400, taken along the line G-G indicated in FIG. 13A.

The RFID tag 400 in the fourth embodiment shown in FIGS. 13A and 13B is identical to the RFID tag 300 in the third embodiment shown in FIGS. 11A and 11B, except that the adhesive application pattern is different. In FIGS. 13A and 13B, components identical to those in FIGS. 11A and 11B are labeled with the same reference numerals used in FIGS. 11A and 11B and duplicate explanations are not repeated here; explanations instead will focus on differences.

In the RFID tag 400 shown in FIGS. 13A and 13B, the adhesive 401 that fastens and protects circuit chip 103 not only covers the outside of the circuit chip 103 all the way to the tops of the sides of the circuit chip 103 but also overflows beyond the upper face of the circuit chip 103, as shown in FIG. 13B. The adhesive 401 in the fourth embodiment is an example of an adhesive applicable in the present art.

In the RFID tag 400 shown in FIGS. 13A and 13B, since the adhesive 401 assumes the application pattern mentioned above, the adhesive 401 overflowing beyond the upper face of the circuit chip 103 is subject to external force, etc., applied to the circuit chip 103 from above, and thereby reduces the load on the circuit chip.

Next will be described an RFID tag manufacturing method (i.e., a method for manufacturing the RFID tag 400 shown in FIGS. 13A and 13B) according to the fourth embodiment of the present art.

The RFID tag manufacturing method in the fourth embodiment is identical to that in the third embodiment described with reference to FIGS. 12A-12E, except that the shape of the heat pressure head is different. A description will be given focusing on this difference.

Figure 14A:
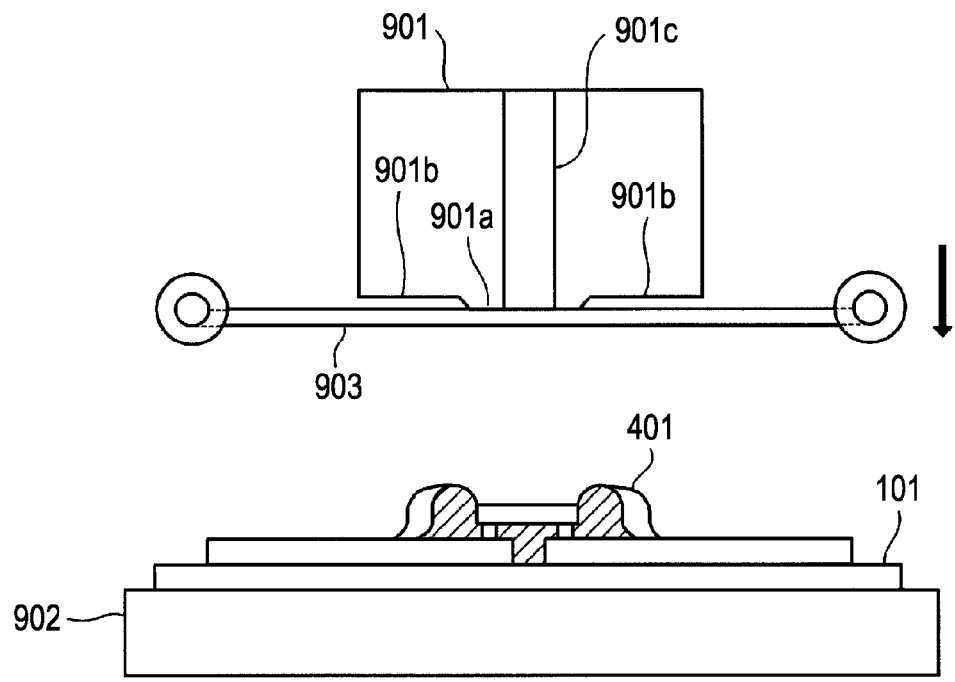
FIGS. 14A-14B are schematic views of the heat pressure head used in the RFID tag manufacturing method in the fourth embodiment, and also illustrates operation of the heat pressure head.
Figure 14B:
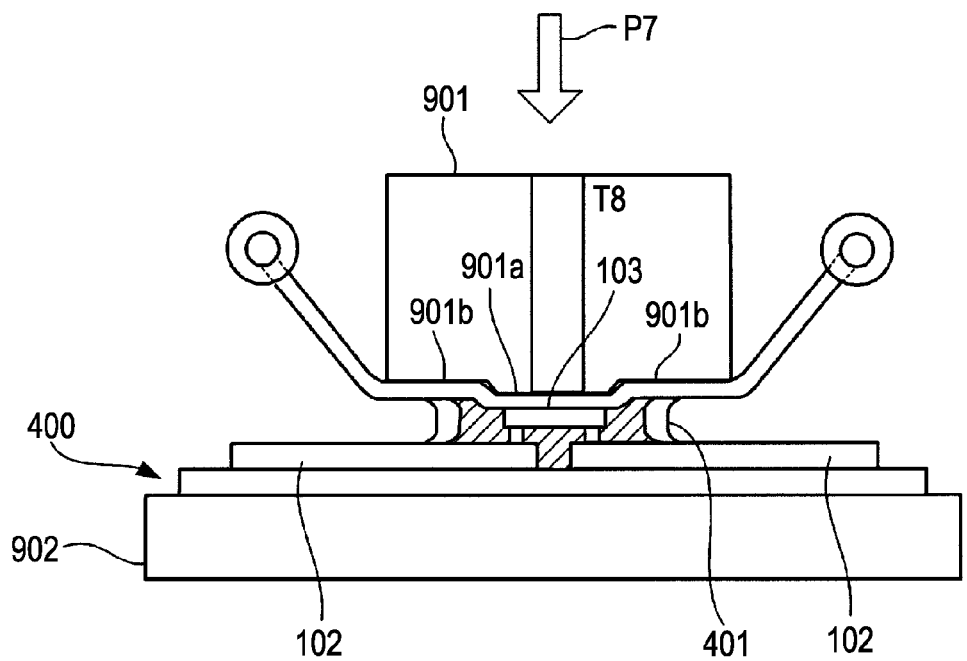

FIGS. 14a-14B are schematic views of the heat pressure head used in the RFID tag manufacturing method in the fourth embodiment, and also illustrate operation of the heat pressure head.

Figure 12E:
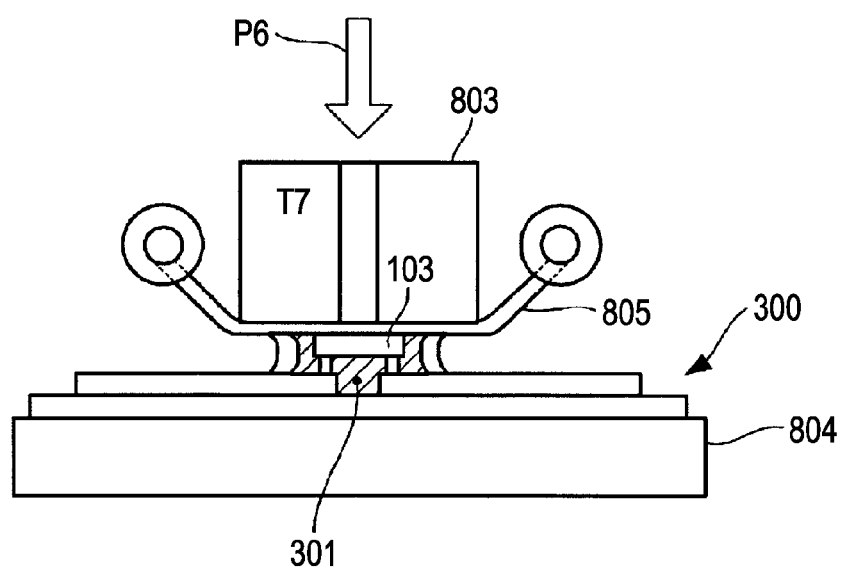

FIGS. 14A-14B show processes in steps S41 and S42 corresponding to those in steps S34 and S35 in the RFID tag manufacturing method in the third embodiment shown in FIGS. 12D and 12E, respectively. The process in step S42 is an example of a combination of a covering process, a heat and pressure applying process, and a peeling process in the present art.

In the RFID tag manufacturing method in the fourth embodiment, processes corresponding to those in steps S31 to S33 in the RFID tag manufacturing method in the third embodiment illustrated in FIGS. 12D and 12E are basically the same as those in the third embodiment and explanations of these are not repeated here. However, in the RFID tag manufacturing method in the fourth embodiment, throughout the processes, the quantity of adhesive 401 applied to the base 101 is larger than that in the RFID tag manufacturing method in the third embodiment. The larger quantity of adhesive applied to the outside of the circuit chip 103 is required so that when the circuit chip 103 is placed thereon, the adhesive 401 not only covers all the way to the tops of the sides of the circuit chip 103 but also overflows beyond the upper face of the circuit chip 103.

In the process in step S41 shown in FIG. 14A, a heat pressure head 901 described below is lowered toward a base 101 placed on the table 902.

The heat pressure head 901 in FIG. 14A is another example of a heat pressure head according to the present art. The heat pressure head 901 includes: an on-chip surface 901a occupying the central area of the underside of the head 901 and reaching the circuit chip 103 as described below; and a lower surface 901b surrounding the on-chip surface 901a and is lower than the on-chip surface 901a. The on-chip surface 901a and lower surface 901b are examples of on-chip surface and lower surface respectively in the present art.

Subsequently, while air drawn from the suction hole 901c sucks a separation sheet 903 into position, the heat pressure head 901 is lowered toward the base 101 placed on a table 902. The separation sheet 902 is of fluorocarbon resin, specifically Teflon (registered trademark) film, and is not susceptible to the adhesive 401. The separation sheet 902 is an example of "a non-adhering sheet" in the present art.

In the process in step S42 shown in FIG. 14B, when the separation sheet 903 reaches the circuit chip 103, the on-chip surface 901a of the heat pressure head 901 applies pressure P7 to the circuit chip 103 via the separation sheet 903 to such a degree as to prevent floating of the circuit chip 103. Simultaneously, the lower surface 901b surrounding the on-chip surface 901a applies the same pressure P7 to areas corresponding to those of the adhesive 401 overflowing beyond the edges of the circuit chip 103. Further, the surfaces 901a and 901b of the heat pressure head 901 heat the corresponding areas at temperature T8 required to heat and cure the adhesive 401.

In the process in step S42, heat and pressure are applied for a predetermined length of time. When heating and curing of the adhesive 401 are finished and the heat pressure head 901 is raised to its original position, the separation sheet 903, which is not susceptible to the adhesive 401, peels off from the adhesive 401. Consequently, the RFID tag 400, in which the cured adhesive 401, etc., are exposed, is complete.

As in the RFID tag manufacturing method in the third embodiment as described above, according to the RFID tag manufacturing method in the fourth embodiment described above with reference to FIGS. 13A to 14B, the RFID tag 400 in which the circuit chip 103, etc. are adequately protected can be manufactured with minimal increases in manufacturing costs. In addition, the overflow of the adhesive 401 beyond all sides of the circuit chip 103 significantly increases protection for the circuit chip 103, etc.

The foregoing descriptions are of RFID tags and RFID tag manufacturing methods according to the first to fourth embodiments of the present art.

A circuit chip fastened on a base maybe coated with a specific resin or the like. For example, the technology of the RFID tag manufacturing method according to the third embodiment of the present art described above can be applied in technology for coating a circuit chip with a specific resin or the like. Below is a description of an example in which the technology of the present art is applied.

Figure 15A:
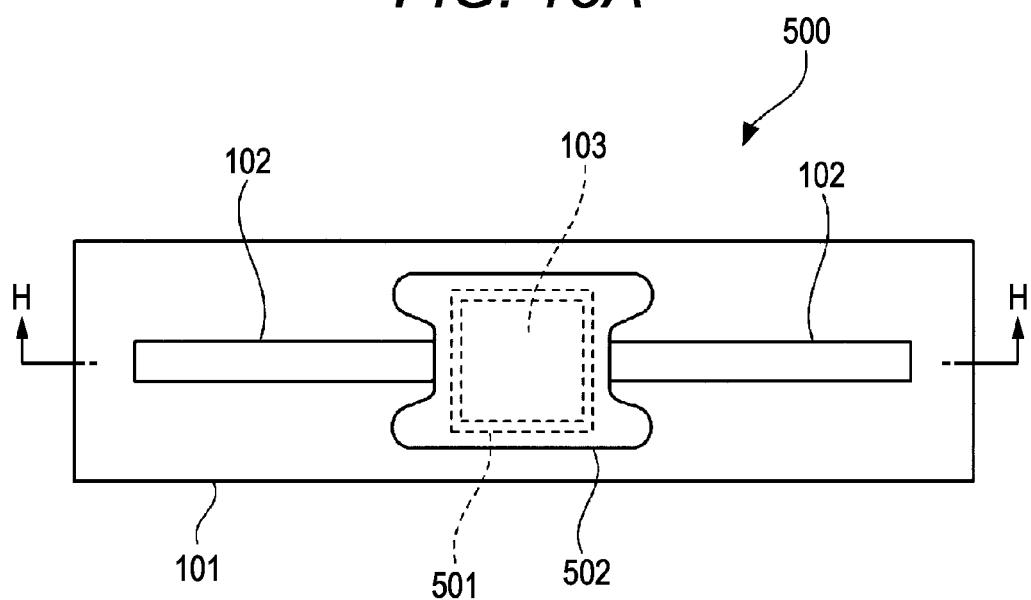
FIG. 15A is a plan schematic view of an example of an RFID tag in which a circuit chip is coated with a specific resin.
Figure 15B:
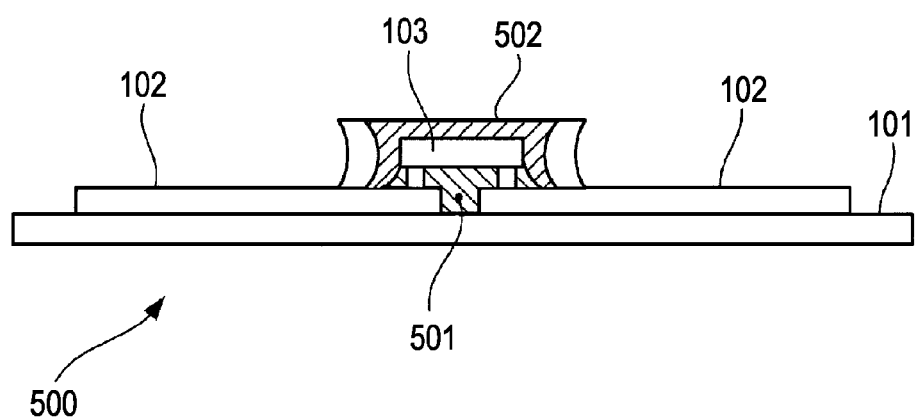
FIG. 15B is a sectional schematic view of the RFID tag shown in FIG. 15A.

FIGS. 15A and 15B are schematic views of an example of an RFID tag in which a circuit chip is coated with a specific resin.

FIG. 15A is a top view of an RFID tag 500, and FIG. 15B is a sectional view of the RFID tag 500, taken along the line H-H indicated in FIG. 15A. In FIGS. 15A and 15B, components identical to those in FIGS. 1A and 1B are labeled with the same reference numerals used in FIGS. 1A and 1B and duplicate explanations thereof are not repeated here.

In the RFID tag 500 shown in FIGS. 15A and 15B, the adhesive 501 is applied only in order to fasten a circuit chip 103 to a base 101 and it covers the outside, i.e., the sides of the circuit chip 103 only slightly. The circuit chip 103, etc., of this RFID tag 500 are protected by a resin 502 which has heating and curing property applied to them. After curing, the resin 502 is not as hard as the adhesive 501. This disperses stress that may be concentrating on areas around the adhesive 501 when the RFID tag 500 is deformed, and thus increases resistance to deformation thereof.

Next will be described a method for manufacturing an RFID tag 500, as shown in FIGS. 15A and 15B, in which the technology of the RFID tag manufacturing method in the third embodiment of the present art described above is applied.

FIGS. 16A to 16E show the process of dropping the resin 502 in a method for manufacturing the RFID tag 500 shown in FIG. 15. FIGS. 17A and 17B show the process of heating and curing the dropped resin 502.

Figure 16A:
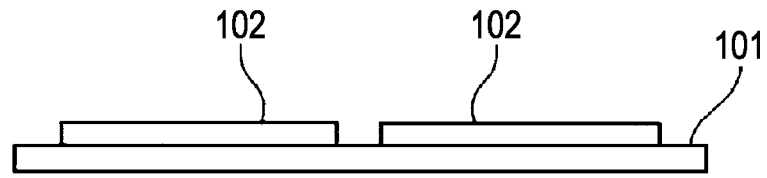
FIGS. 16A-16E show the process of dropping the resin in a method for manufacturing the RFID tag 400 shown in FIGS. 15A-15B.
Figure 16B:
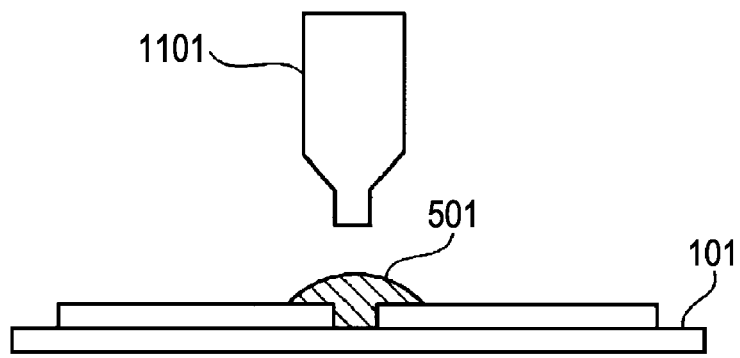
Figure 16C:
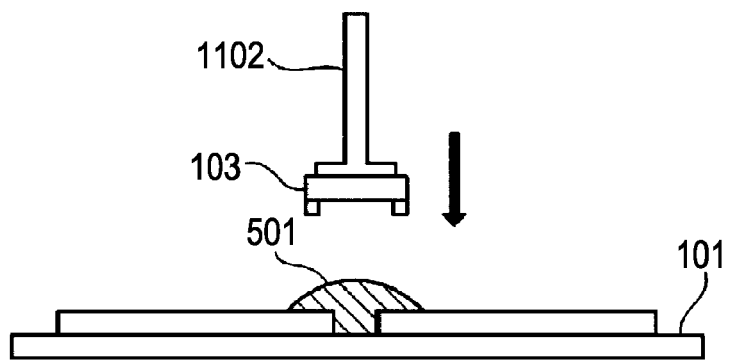
Figure 16D:
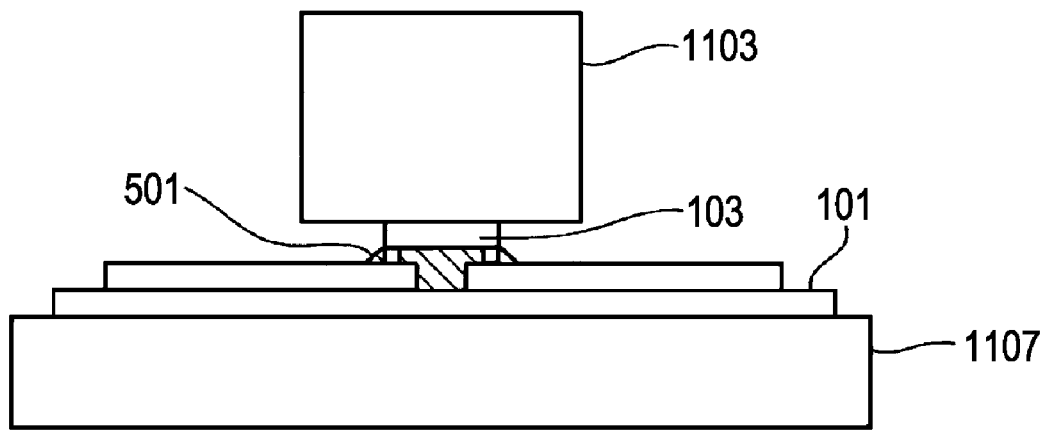
Figure 16E:
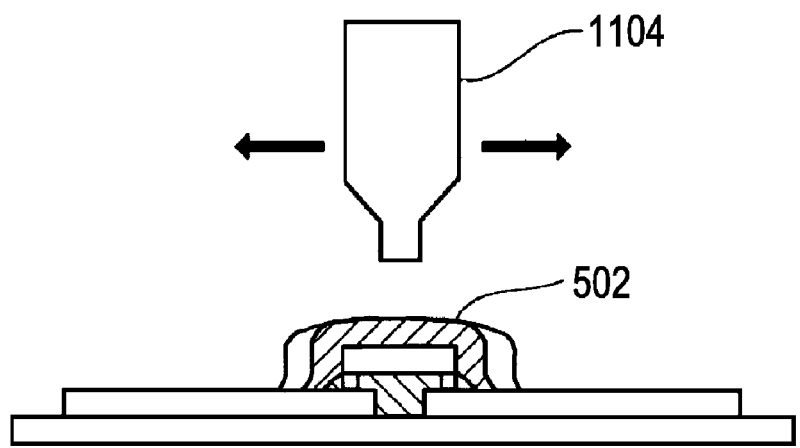
Figure 17A:
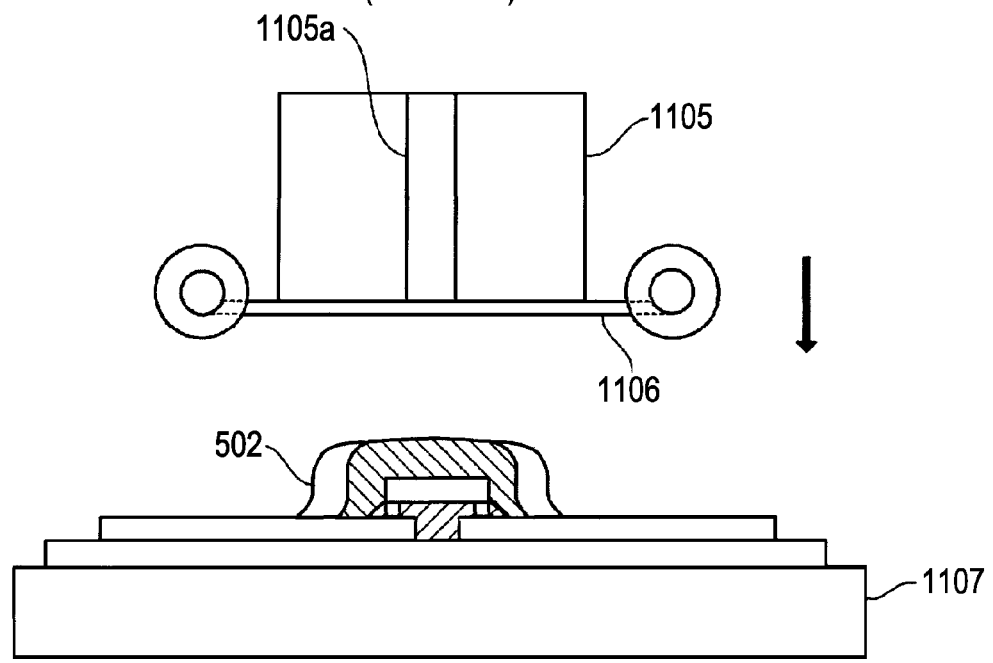
FIGS. 17A-17B show the process of heating and curing the dropped resin 402.
Figure 17B:
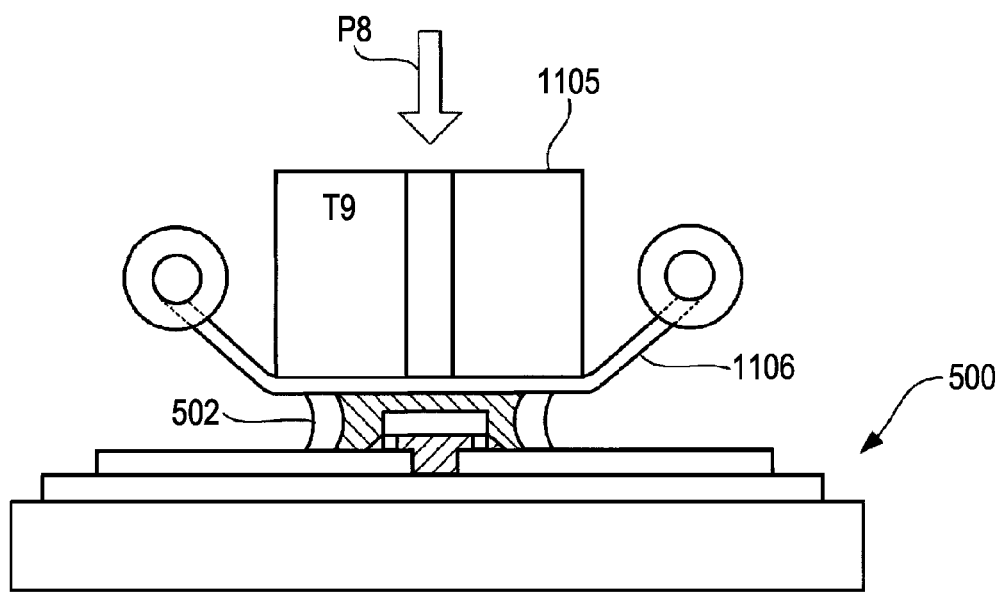

In the RFID tag manufacturing method in FIGS. 16A to 17B, a base 101 on which antennae 102 are wired is first prepared (step S51) (FIG. 16A). Next, an adhesive dispenser 1101 applies an adhesive 501 onto the base 101 (step S52) (FIG. 16B). The quantity of adhesive 501 applied in step S52 is smaller than the quantities applied in the RFID tags in the first to the fourth embodiments of the present art described above, but this quantity is sufficient to fasten the circuit chip 103. Unlike the patterns of application of adhesive in the RFID tags in the first to fourth embodiments of the present art, the pattern of the application of adhesive 501 is formed by simply dropping the adhesive 501. Subsequently, a custom chip mounter 1102 conveys a circuit chip 103 onto the adhesive 501 applied, and thus locates the circuit chip 103 on the base 101 and in the correct position for circuit chip 103 (step S53) (FIG. 16C).

Subsequently, a heat pressure head 1103 is lowered toward the base 101 on a table 1107 in order to heat and cure the adhesive 501 and press the circuit chip 103 onto the base 101 so as to prevent the circuit chip 103 from floating (step S54) (FIG. 16D).

After the adhesive 501 is heated and cured and the circuit chip 103 consequently becomes fastened, a resin dispenser 1104 applies a coating resin onto the circuit chip 103 and the area around its periphery (step S55) (FIG. 16E). In applying the resin in step S55, the same method is used as in the RFID tag manufacturing method in the third embodiment of the present art. That is, in step S55, the resin 502 is applied by the application method in the RFID tag manufacturing method in the first embodiment, shown in FIGS. 4A to 4D, which is also adopted in the RFID tag manufacturing method in the third embodiment.

Upon finishing the application of the resin 502, a heat pressure head 1105 for curing the resin 502 is lowered toward the base 101 on the table 1107 while air drawn from the suction hole 1105a secures a separation sheet 1106 (step S56) (FIG. 17). The separation sheet 1106 is of fluorocarbon resin, specifically Teflon (registered trademark) film, and is not susceptible to the adhesive 501. Although not shown in FIGS. 16A-16E (except in step S54 (FIG. 16D)), the processes from steps S52 to S55 described above are all performed, with the base 101 placed on the table 1107.

In the process in step S57 (FIG. 17B) (subsequent to step S56 described above), the heat pressure head 1105 is lowered to a predetermined position such that the resin 502 covering the circuit chip 103 maintains a required thickness. When this position is reached, the heat pressure head 1105 applies pressure P7 to the resin 502 via the separation sheet 1106 so as to be able to maintain this position. Simultaneously, the heat pressure head 1105 heats the resin 502 at temperature T9 that is required to heat and cure the resin 502 via the separation sheet 1106.

In the process in step S57, such heat and pressure are applied for a predetermined length of time. When heating and curing of the resin 502 are finished and the heat pressure head 1105 is raised to its original position, the separation sheet 1106, which is not susceptible to the resin 502, peels off from the resin 502. Consequently, the RFID tag 500 in which the cured resin 502, etc. are exposed becomes complete.

In the RFID tag manufacturing method described with reference to FIGS. 16A to 17B, heat and pressure for curing the resin 502 are applied via the separation sheet 1106. Accordingly, the resin 502 is securely prevented from contaminating the heat pressure head 1105. This facilitates the curing of the resin 502 covering the upper face of the circuit chip 103 and this resin 502 provides secure protection for the circuit chip 103. Further, in the RFID tag manufacturing method, the thickness of the resin 502 covering the upper face of the circuit chip 103 is determined by the position to which the heat pressure head 1105 is lowered. Accordingly, setting the lowered position appropriately makes it possible to deposit a required thickness of the resin 502 to cover the upper face of the circuit chip 103.

Thus, in the RFID tag manufacturing method shown in FIGS. 16a to 17B, the application of the resin 502 and the application of heat and pressure can easily be performed by adapting the adhesive application method and heat and pressure application method of the RFID tag manufacturing method in the third embodiment of the present art. This RFID tag manufacturing method enables the formation of an RFID tag 500 in which resistance to deformation is enhanced by coating the circuit chip 103 with the resin 502.

Having described the simple, parallelepipedic heat pressure head 1105 shown in FIGS. 17A and 17B as an example of the heat pressure head used to apply heat and pressure to the resin 502, the heat pressure head for the resin 502 may have a different form as described below.

Figure 18A:
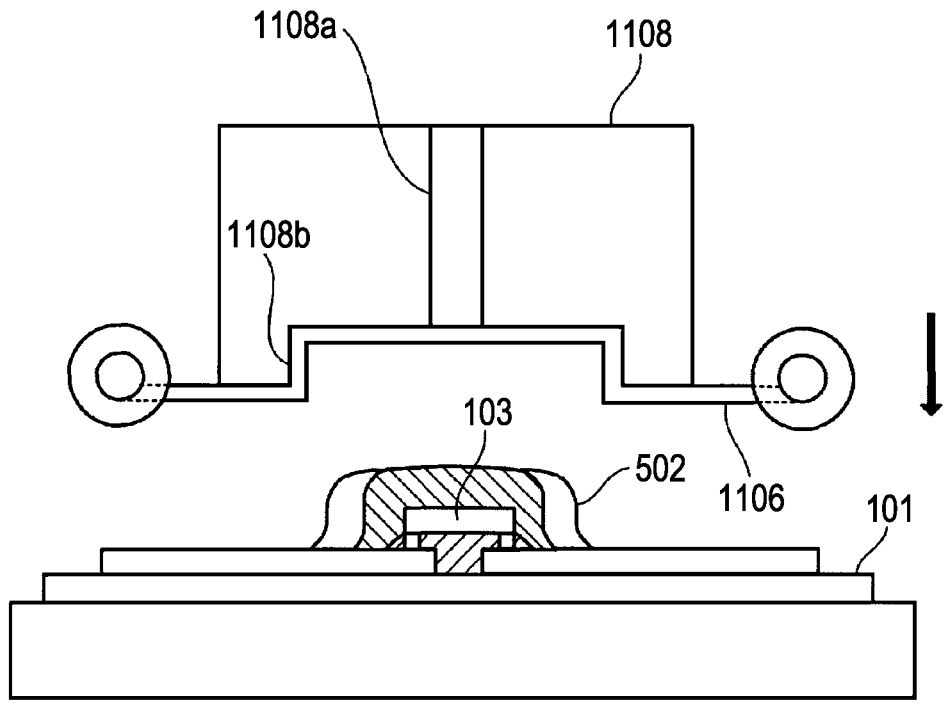
FIGS. 18A-18B are schematic views of another form of heat pressure head.
Figure 18B:
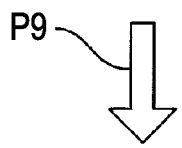
Figure 18B:
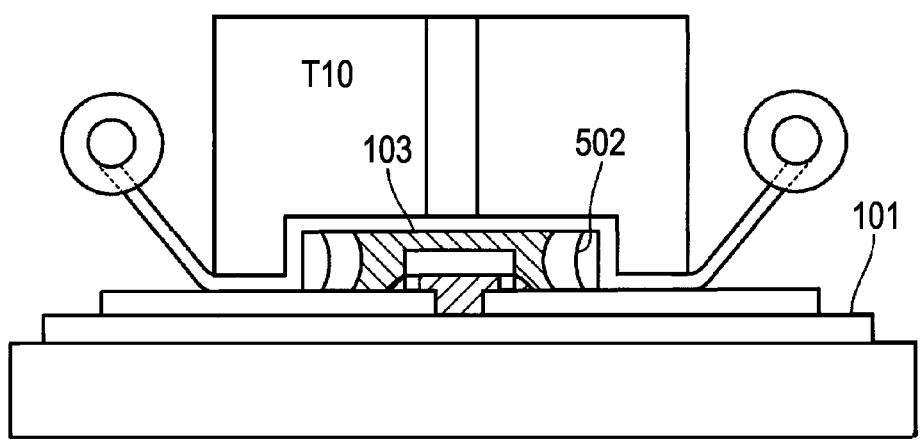

FIGS. 18A and 18B are schematic views of another form of heat pressure head.

FIGS. 18A and 18B show the processes of steps S56' and S57' using this heat pressure head 1108, which correspond to the processes in steps S56 and S57 respectively in FIGS. 17A and 17B.

In the heat pressure head 1108 shown in FIGS. 18A and 18B, the face opposite a base 101 has a recess 1108b so formed as to accommodate a resin 502 already incorporating a circuit chip 103. In step S56', a separation sheet 1106 is sucked onto the internal face of the recess 1108b by air drawn from a suction hole 1108a, and in this state, the heat pressure head 1108 is lowered.

In step S56', the heat pressure head 1108 is lowered to the position where the edges of the recess 1108b reaches the base 101. When this is reached, the heat pressure head 1108 applies pressure P9 to the resin 502 so as to be able to maintain this position. Simultaneously, it heats the resin 502 to temperature T10 that is required to heat and cure the resin 502.

The depth of the recess 1108b of the heat pressure head 1108 is predetermined so that when the edges of the recess 1108b reach the base 101, the resin 502 covering the upper face of the circuit chip 103 acquires the required thickness. The application of heat and pressure to the resin 502 by the heat pressure head 1108, unlike those by the heat pressure head 1105 shown in FIGS. 17A and 17B, gives only one thickness to the resin 502 covering the upper face of the circuit chip 103. However, control of the lowering of the heat pressure head 1108 is simpler than that for the heat pressure head 1105, which yields an advantage.

The RFID tag 500 in which the circuit chip 103 is coated with the resin 502 and the method for manufacturing such an RFID tag 500 have been described with reference to FIGS. 15A to 18B. The foregoing is a description of an example of the form in which the circuit chip 103 is coated with only one layer of resin 502. However, the circuit chip 103 may be further protected by its being coated with more than one layer.

Figure 19A:
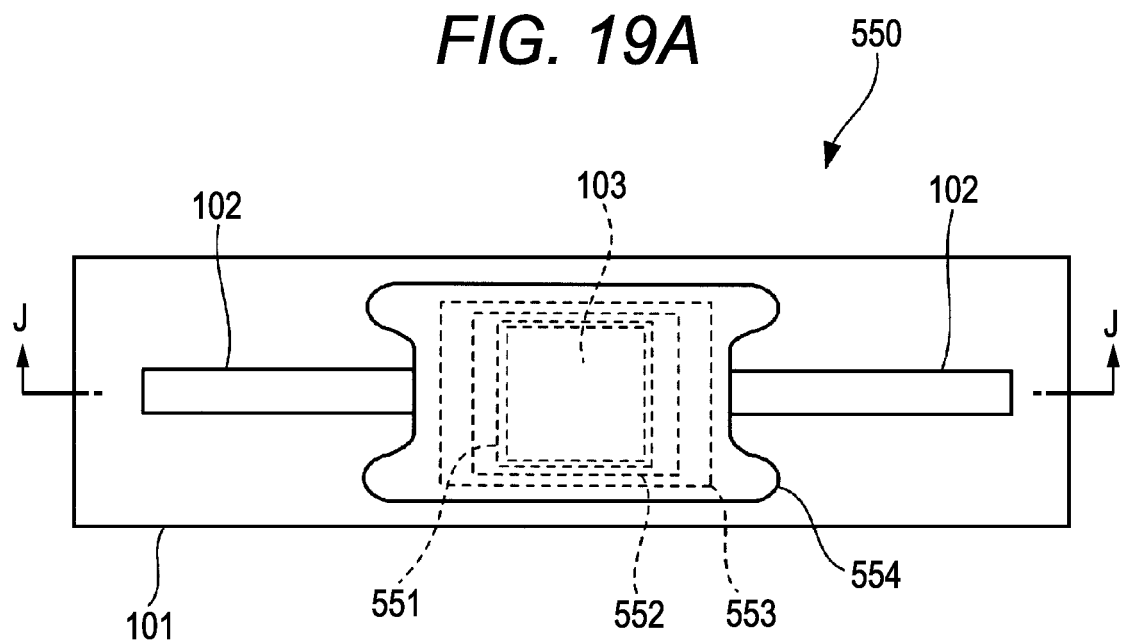
FIG. 19A is a plan schematic view of an RFID tag in which more than one layer of the resin 402 coating are applied.
Figure 19B:
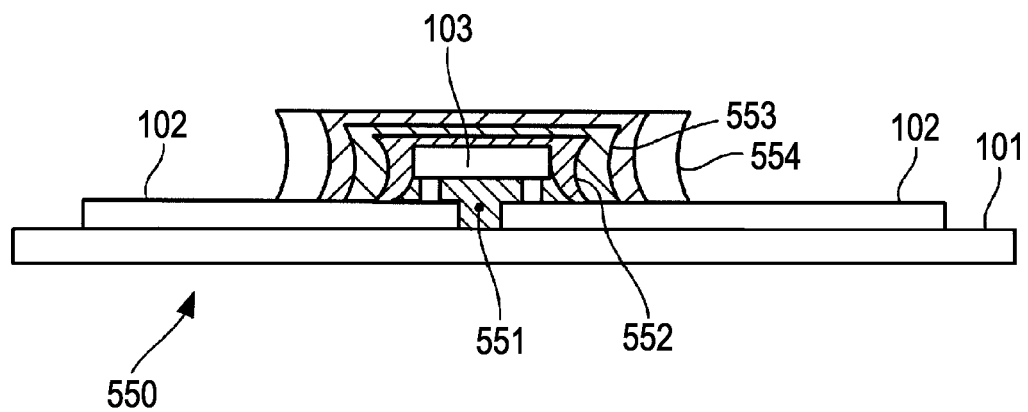
FIG. 19B is a sectional schematic view of the RFID tag shown in FIG. 19A.

FIGS. 19A and 19B are schematic views of an RFID tag in which more than one layer of the resin 502 coating are applied.

FIG. 19A is a top view of the RFID tag 550, and FIG. 19B is a sectional view of the RFID tag 550, taken along the line J-J in FIG. 19A. In FIGS. 19A and 19B, components identical to those in FIGS. 1A and 1B are labeled with the same reference numerals used in FIGS. 1A and 1B and duplicate explanations of these components are not repeated here.

In the RFID tag 550 shown in FIGS. 19A and 19B, a circuit chip 103 attached to a base 101 with an adhesive 551 is coated with three layers of first, second, and third resins 552, 553, and 554 respectively. In the RFID tag 550 of FIGS. 19A and 19B, the circuit chip 103 is protected by its being coated in these three coating layers. Of the resins applied in three layers, each of the first and second resins 552 and 553 has an application pattern formed by simply dropping the resin as in the case of the adhesive 551. However, the outermost third resin 554 has an application pattern formed by the application method described with reference to FIGS. 4A to 4D.

In the RFID tag 550 shown in FIGS. 19A and 19B, after curing of the resins, the first resin 552 is softer than the adhesive 551, the second resin 553 is softer than the first resin 552, and the third resin 554 is softer than the second resin 553. Forming the layers such that the further out a layer is formed, the softer it is, disperses stress concentrating on the adhesive 551 and areas around the edges of each of the resin layers when the RFID tag 550 is deformed. This accordingly enhances resistance to deformation of the RFID tag 550.

The RFID tag manufacturing method for obtaining the RFID tag 550 shown in FIGS. 19A and 19B adapts the adhesive application method and heat and pressure application method of the RFID tag manufacturing method in the third embodiment of the present art such as to apply the resins in layers and apply pressure and heat to these resins. In this RFID tag manufacturing method, the series of processes from steps S55 to S57 in the RFID tag manufacturing method described with reference to FIGS. 16A to 17B is repeated three times. To be specific, the process of applying each of the first and second resins 552 and 553 corresponding to step S55 is the same as the process of applying the adhesive 551 (i.e., the process of simply dropping the adhesive 551) in step S52. Needless to say, the RFID tag manufacturing method for obtaining the RFID tag 550 shown in FIGS. 19A and 19B facilitates curing of each of the resin layers.

In the foregoing description, a sheet member made of PET film is used as an example of the sheet member in the present art. However, the present art is not limited to this but may use a sheet member made of, for example, paper.

The RFID tag manufacturing method according to the first embodiment of the present art is efficient because the application of heat and pressure for curing, etc., of the adhesive occurs simultaneously with the fixing of the applied sheet member in position. Further, in the RFID tag manufacturing method according to the first embodiment of the present art, the heat and pressure are applied via a sheet member. This securely prevents an adhesive from contaminating tools and suchlike used in the application of heat and pressure. Accordingly, as in the typical forms described above, a larger quantity of adhesive for fastening the circuit chip can be applied to cover the sides of the circuit chip all the way to the position equal to or greater than the height of the circuit chip. Therefore, the adhesive for fixing the circuit chip can also protect the circuit chip, etc. Thus, the RFID tag manufacturing method according to the first embodiment of the present art enables the efficient application of heat and pressure to the adhesive, it also enables protection of the circuit chip without involving a special process such as coating the circuit chip with a resin or covering it with a hard reinforcement or the like, and hence increases in manufacturing costs because of the additional processes are avoided. That is, the RFID tag manufacturing method according to the first embodiment of the present art makes it possible to manufacture with minimal cost increase an RFID tag in which the circuit chip, etc., are protected.

In the RFID tag according to the first embodiment of the present art, the adhesive for fixing the circuit chip covers the sides of the circuit chip all the way to the position equal to or exceeding the height of the circuit chip, and thus also protects the circuit chip, etc., with this adhesive. In addition, the RFID tag according to the first embodiment of the present art has a structure that is covered with the sheet member, which makes it possible to cure, without contaminating tools, etc. during the manufacture, the larger amount of adhesive by applying heat and pressure simultaneously with fixing the sheet member in the position. Thus, the RFID tag according to the first embodiment of the present art ensures efficient application of heat and pressure to adhesive during the manufacture, and protects the circuit chip without involving a special process such as coating the circuit chip with resin or covering it with a hard reinforcement, etc., and hence avoids manufacturing cost increases because of the additional processes. That is, the RFID tag according to the first embodiment of the present art ensures the protection of the circuit chip, etc., with minimal manufacturing cost increases.

In the RFID tag manufacturing method according to the second embodiment of the present art, the adhesive for fastening the circuit chip covers the sides of the circuit chip all the way to the position equal to or exceeding the height of the circuit chip, and thus also protects the circuit chip, etc. sufficiently with this adhesive. Further, in the RFID tag manufacturing method according to the second embodiment of the present art, heat and pressure for curing the adhesive, etc. is applied via the sheet. This facilitates the application of heat and pressure without contaminating tools, etc. Thus, the RFID tag manufacturing method according to the second embodiment of the present art ensures the protection of the circuit chip without involving a special process such as coating the circuit chip with resin or covering it with a hard reinforcement, etc., and hence avoids manufacturing cost increases because of the additional processes. That is, the RFID tag manufacturing method according to the second embodiment of the present art makes it possible to manufacture with minimal cost increases an RFID tag in which a circuit chip, etc., are protected.

The order of the embodiments is not indicative of the superiority and inferiority of the art. Although the embodiments of the present arts have been described in detail, it should be understood that the various changes, substitutions, and alterations could be made hereto without departing from the spirit and scope of the art.

What is claimed is:

1. A manufacturing method for an RFID tag, comprising:
    an application process in which a heat-curable adhesive is applied to an area where a circuit chip is placed on a base to which antennae are wired so as to be connected with the circuit chip to be placed;
    a placement process in which the circuit chip is placed in the area where the adhesive is applied in the application process, and thereby the circuit chip is connected with the antennae;
    a covering process in which the circuit chip placed on the base is covered with a sheet member having an adhesive layer on its surface, such that the adhesive layer faces the base; and
    a heat and pressure applying process in which pressure is applied to the sheet member toward the base, and heat and pressure are applied to the circuit chip from above the sheet member, thereby curing the adhesive and fixing the circuit chip and the sheet member on the base; wherein the application process is a process in which the adhesive is applied so that the quantity of adhesive is sufficient for the adhesive to be applied to a position equal to or exceeding a height of the circuit chip when the chip is placed on the base, and wherein the heat and pressure applying process is a process in which the heat and pressure are applied to the circuit chip and the sheet member by using a heat pressure head, the heat pressure head having a first surface corresponding to an area above the circuit chip, a second surface corresponding to an area outside of the circuit chip, extending and surrounding the first surface and higher than the first surface, and a third surface located inside the second surface and surrounding the first surface and lower than the first surface.

2. The manufacturing method according to claim 1, wherein the application process is a process in which the adhesive is applied over an area wider than an area of the circuit chip.

3. The manufacturing method according to claim 1, wherein the application process is a process in which the adhesive is applied so that the quantity of adhesive is sufficient for the adhesive to be applied to a position equal to or exceeding a height of the circuit chip when the chip is placed on the base.

4. The manufacturing method according to claim 1, wherein the covering process is a process in which for use as the sheet member, a sheet member made of PET film or paper is used.

5. The manufacturing method according to claim 1, wherein the heat and pressure applying process is a process in which pressure applied to an area above the circuit chip is higher than pressure applied to an area outside of the circuit chip.

6. The manufacturing method according to claim 1, wherein the heat and pressure applying process is a process in which an area above the circuit chip is heated at a temperature higher than an area outside of the circuit chip.

7. The manufacturing method according to claim 1, wherein the heat and pressure applying process is a process in which the heat and pressure are applied to the circuit chip and the sheet member by using a heat pressure head, the heat pressure head having a first surface corresponding to an area above the circuit chip and a second surface corresponding to an area outside of the circuit chip, extending and surrounding the first surface and higher than the first surface.

8. A manufacturing method for an RFID tag, comprising:
    an application process in which a heat-curable adhesive is applied to an area where a circuit chip is placed on a base to which antennae are wired so as to be connected with the circuit chip to be placed;
    a placement process in which the circuit chip is placed in the area where the adhesive is applied in the application process, and thereby the circuit chip is connected with the antennae;
    a covering process in which the circuit chip placed on the base is covered with a sheet member having an adhesive layer on its surface, such that the adhesive layer faces the base; and
    a heat and pressure applying process in which pressure is applied to the sheet member toward the base, and heat and pressure are applied to the circuit chip from above the sheet member, thereby curing the adhesive and fixing the circuit chip and the sheet member on the base, wherein the heat and pressure applying process is a process in which heat and pressure are applied to the circuit chip and the sheet member by using a heat and pressure head, the heat and pressure head having a first area corresponding to an area above the circuit chip and a second area surrounding the first area and disposed so as to allow the first area to be inserted or pulled.

9. The manufacturing method according to claim 8, wherein the application process is a process in which the adhesive is applied over an area wider than an area of the circuit chip.

10. The manufacturing method according to claim 8, wherein the application process is a process in which the adhesive is applied so that the quantity of adhesive is sufficient for the adhesive to be applied to a position equal to or exceeding a height of the circuit chip when the chip is placed on the base.

11. The manufacturing method according to claim 8, wherein the covering process is a process in which for use as the sheet member, a sheet member made of PET film or paper is used.

12. The manufacturing method according to claim 8, wherein the heat and pressure applying process is a process in which pressure applied to an area above the circuit chip is higher than pressure applied to an area outside of the circuit chip.

13. The manufacturing method according to claim 8, wherein the heat and pressure applying process is a process in which an area above the circuit chip is heated at a temperature higher than an area outside of the circuit chip.

14. The manufacturing method according to claim 8, wherein the heat and pressure applying process is a process in which the heat and pressure are applied to the circuit chip and the sheet member by using a heat pressure head, the heat pressure head having a first surface corresponding to an area above the circuit chip and a second surface corresponding to an area outside of the circuit chip, extending and surrounding the first surface and higher than the first surface.

* * * * *